(12) United States Patent
Ikenaga

(10) Patent No.: US 11,220,736 B2
(45) Date of Patent: Jan. 11, 2022

(54) DEPOSITION MASK

(71) Applicant: Dai Nippon Printing Co., Ltd., Tokyo (JP)

(72) Inventor: Chikao Ikenaga, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 16/461,936

(22) PCT Filed: Oct. 24, 2017

(86) PCT No.: PCT/JP2017/038396
§ 371 (c)(1),
(2) Date: May 17, 2019

(87) PCT Pub. No.: WO2018/092531
PCT Pub. Date: May 24, 2018

(65) Prior Publication Data
US 2019/0323117 A1    Oct. 24, 2019

(30) Foreign Application Priority Data

Nov. 18, 2016  (JP) .............................. JP2016-225435

(51) Int. Cl.
*C23C 14/04* (2006.01)
*C23F 1/02* (2006.01)
(Continued)

(52) U.S. Cl.
CPC ............ *C23C 14/042* (2013.01); *C23C 14/04* (2013.01); *C23F 1/02* (2013.01); *C23C 14/24* (2013.01); *H01L 51/0011* (2013.01); *H01L 51/56* (2013.01)

(58) Field of Classification Search
CPC ..... C23C 14/04; C23C 14/042; C23C 4/0005; C23C 14/044; C23C 16/04; C23C 16/042; C30B 25/04
See application file for complete search history.

(56) References Cited

U.S. PATENT DOCUMENTS

| 9,911,638 B2 | 3/2018 | Okita et al. |
| 2005/0115503 A1 | 6/2005 | Hagiwara et al. |

(Continued)

FOREIGN PATENT DOCUMENTS

| CN | 101013274 A | 8/2007 |
| CN | 101896635 A | 11/2010 |

(Continued)

OTHER PUBLICATIONS

International Search Report and Written Opinion (Application No. PCT/JP2017/038396) dated Jan. 30, 2018.

(Continued)

*Primary Examiner* — Aiden Lee
(74) *Attorney, Agent, or Firm* — Burr & Brown, PLLC

(57) ABSTRACT

A deposition mask includes a first surface facing to the deposition target substrate, and a second surface opposite to the first surface. The deposition mask includes: an effective area in which a plurality of through holes are formed and a longitudinal direction in which one or more of the effective areas are arranged along the longitudinal direction. At least in a central area of the longitudinal direction, the deposition mask is warped to be convex on the first surface in a cross section orthogonal to the longitudinal direction.

4 Claims, 14 Drawing Sheets

(51) Int. Cl.
*C23C 14/24* (2006.01)
*H01L 51/00* (2006.01)
*H01L 51/56* (2006.01)

(56) References Cited

U.S. PATENT DOCUMENTS

| | | | |
|---|---|---|---|
| 2007/0184195 A1 | 8/2007 | Hatakeyama et al. | |
| 2009/0127236 A1* | 5/2009 | Hong | G03F 7/12 219/121.64 |
| 2010/0260938 A1* | 10/2010 | Kondo | C23C 14/042 427/282 |
| 2012/0107506 A1 | 5/2012 | Ukigaya et al. | |
| 2012/0328851 A1 | 12/2012 | Kang | |
| 2014/0147949 A1* | 5/2014 | Hong | C23C 14/042 438/46 |
| 2014/0248729 A1 | 9/2014 | Fujiwara et al. | |
| 2016/0186305 A1 | 6/2016 | Han | |
| 2016/0208392 A1 | 7/2016 | Ikenaga et al. | |
| 2017/0056911 A1* | 3/2017 | Kang | B05C 21/005 |
| 2017/0110661 A1* | 4/2017 | Lee | H01L 51/0004 |
| 2017/0141315 A1 | 5/2017 | Ikenaga | |

FOREIGN PATENT DOCUMENTS

| | | |
|---|---|---|
| CN | 106024565 A | 10/2016 |
| JP | 2006-162749 A | 6/2006 |
| JP | 2007-207632 A1 | 8/2007 |
| JP | 2008-196002 A1 | 8/2008 |
| JP | 2010-185107 A1 | 8/2010 |
| JP | 2015-214741 A1 | 12/2015 |
| JP | 2016-148112 A1 | 8/2016 |

OTHER PUBLICATIONS

Extended European Search Report (Application No. 17872222.9) dated Mar. 4, 2020.
Chinese Office Action (with English translation), Chinese Application No. 201711138223.4, dated Jan. 22, 2020 (10 pages).
Chinese Office Action (Application No. 201711138223.4) dated Aug. 3, 2020.
Taiwanese Office Action (Application No. 106137311) dated Sep. 9, 2020 (with English translation).
English translation of International Preliminary Report on Patentability (Chapter I) (Application No. PCT/JP2017/038396) dated May 31, 2019 8 pages.
Taiwanese Office Action (Application No. 106137311) dated Feb. 5, 2021 (with English translation).
Chinese Office Action (Application No. 201711138223.4) dated Feb. 24, 2021 (with English translation).
Japanese Office Action (Application No. 2018-551546) dated Jul. 27, 2021 (with English translation).
European Office Action (Application No. 17 872 222.9) dated Nov. 2, 2021.

\* cited by examiner

|  |  | Annealing Time(sec) | | | | | |
|---|---|---|---|---|---|---|---|
|  |  | 30 | | 60 | | 90 | |
|  |  | D2-D1 (mm) | Deposition Quality | D2-D1 (mm) | Deposition Quality | D2-D1 (mm) | Deposition Quality |
| Annealing Temperature (°C) | 350 | 0.0821 | ○ | 0.0814 | ○ | 0.0782 | ○ |
| | 400 | 0.0803 | ○ | 0.0594 | ○ | 0.0562 | ○ |
| | 450 | 0.0710 | ○ | 0.0505 | ◎ | 0.0362 | ◎ |
| | 500 | 0.0672 | ○ | 0.0393 | ◎ | 0.0157 | ◎ |
| | 550 | 0.0644 | ○ | 0.0239 | ◎ | 0.0048 | ○ |
| | 600 | 0.0442 | — | 0.0099 | — | 0.0003 | — |

FIG. 26

|  |  | Annealing Time(sec) | | | | | |
|---|---|---|---|---|---|---|---|
|  |  | 30 | | 60 | | 90 | |
|  |  | D2-D1 (mm) | Deposition Quality | D2-D1 (mm) | Deposition Quality | D2-D1 (mm) | Deposition Quality |
| Annealing Temperature (°C) | 350 | 0.0813 | ○ | 0.0811 | ○ | 0.0777 | ○ |
| | 400 | 0.0811 | ○ | 0.0585 | ○ | 0.0542 | ○ |
| | 450 | 0.0704 | ○ | 0.0493 | ◎ | 0.0361 | ◎ |
| | 500 | 0.0657 | ○ | 0.0389 | ◎ | 0.0152 | ◎ |
| | 550 | 0.0594 | ○ | 0.0229 | ◎ | 0.0044 | ○ |
| | 600 | 0.0430 | — | 0.0071 | — | -0.0008 | — |

FIG. 27

DEPOSITION MASK

CROSS-REFERENCE TO RELATED APPLICATIONS

This application is based upon and claims the benefit of priority from Japanese Patent Application No. 2016-225435, filed on Nov. 18, 2016; the entire contents of which are incorporated herein by reference.

TECHNICAL FIELD

The present disclosure relates to a deposition mask that is used when a deposition material is deposited onto a deposition target substrate in a desired pattern.

BACKGROUND ART

A display device used in a portable device such as a smart phone and a tablet PC is required to have high fineness, e.g., a pixel density of not less than 500 ppi. In addition, there is increasing demand that the portable device is applicable in the ultra high-definitions (UHD) reference. In this case, the pixel density of the display device needs to be not less than 800 ppi or more, for example.

An organic EL display device draws attention because of its excellent responsibility, low power consumption and excellent contrast. A known method for forming pixels of an organic EL display device is a method which uses a deposition mask including through-holes that are arranged in a desired pattern, and forms pixels in the desired pattern. To be specific, a deposition step is performed in which a deposition mask is firstly brought into contact with an organic EL substrate (deposition target substrate/substrate onto which a deposition material is to be deposited) for organic EL display device, and then the organic EL substrate and the deposition mask in contact therewith are put into a deposition apparatus so as to deposit an organic material (deposition material) onto the organic EL substrate. When the deposition mask is brought into contact with the deposition target substrate, a magnet is placed on a surface of the deposition target substrate, which is opposed to the deposition mask, for example. By bringing the deposition mask close to the deposition target substrate, the deposition mask can be withdrawn to the magnet by a magnetic force from the magnet so as to be brought into contact with the deposition target substrate.

As such a deposition mask, a deposition mask in which a plurality of through holes is formed therein by etching using a photolithographic technique is known (see JP2015-214741A). In the deposition mask disclosed in JP2015-214741A, first recesses are formed by etching from the side of one surface of a metal plate for forming a deposition mask, and second recesses are formed by etching from the side of the other surface of the metal plate, so that respective through holes are formed by the first recesses and the second recesses. Thus, it is possible to obtain a deposition mask in which a plurality of effective areas having a plurality of through holes is arranged along a direction parallel to a longitudinal direction of the deposition mask.

SUMMARY

When a deposition material is deposited onto a deposition target substrate with the use of a deposition mask, the deposition material adheres not only to the substrate but also to the deposition mask. For example, some of the deposition material moves toward the deposition target substrate along a direction largely inclined with respect to the normal direction of the deposition mask. Such a deposition material arrives at a wall surface of a through hole in the deposition mask to adhere thereto, before it arrives at the deposition target substrate. In this case, it is difficult for the deposition material to adhere to an area of the deposition target substrate, which is located near the wall surface of the through hole in the deposition mask. As a result, there is a possibility that a thickness of the deposition material adhering to this area is smaller than that of another portion, and/or that there is a portion onto which no deposition material is deposited. Namely, it can be considered that deposition near a wall surface of a through hole in the deposition mask becomes unstable. Thus, when a deposition mask is used for forming pixels of an organic EL display device, dimensional precision and/or positional precision of pixels may be lowered, which results in lowering of luminous efficacy of the organic EL display device. For the purpose of preventing this trouble, it is required that a thickness of a deposition mask as a whole is reduced, in order that a height of a wall surface of a through hole in the deposition mask is reduced, and that a ratio of a deposition material, which adheres to the wall surface of the through hole, is decreased.

However, a deposition mask having a smaller thickness, i.e., a thinned deposition mask is likely to get wrinkled, when it is brought into contact with a deposition target substrate. In particular, when a deposition mask has a longitudinal direction and is suspended along the longitudinal direction, the deposition mask is likely to have wrinkles extending along the longitudinal direction. The present inventors have intensively studied such wrinkles of a deposition mask, and found that portions in the deposition mask are withdrawn at uneven timings to a deposition target substrate by a magnetic force of a magnet positioned opposed to the deposition.

It is known that a magnetic force acting between two objects is inversely proportional to a square of a distance between these two objects. When a deposition mask has a longitudinal direction and is suspended along the longitudinal direction, the deposition mask has minute undulations in a width direction of the deposition mask, because of the suspension. The present inventors consider that the minute undulations generated in the width direction of the deposition mask make uneven a distance between the deposition mask and the magnet in the width direction of the deposition mask, which results in uneven timings at which the deposition mask is withdrawn to a deposition target substrate. Namely, a portion of the deposition mask, which is closer to the magnet, is considered to be brought into contact with the deposition target substrate, prior to another portion of the deposition mask, which is further to the magnet. A frictional force acts on a portion where the deposition mask and the deposition target substrate are in contact with each other, and the frictional force prevents the deposition mask at this portion from moving in a plate plane direction of the deposition target substrate. Thus, an area positioned between two portions of the deposition mask, which are firstly brought into contact with the deposition target substrate, cannot be brought into contact with the deposition target substrate, because the deposition mask at these contact portions is prevented from moving in the plate plane direction of the deposition target substrate. As compared with a deposition mask which is not thinned, a thinned deposition mask is considered to be more likely to get wrinkled when it is brought into contact with a deposition target substrate.

The present disclosure has been made in view of these circumstances. The object of the present disclosure is to prevent a deposition mask from getting wrinkled, when the deposition mask is brought into contact with a deposition target substrate.

A deposition mask of the present disclosure is used in depositing a depositing material onto a deposition target substrate, comprising a first surface facing to the deposition target substrate, and a second surface opposite to the first surface,
wherein:
the deposition mask includes:
an effective area in which a plurality of through holes are formed; and
a longitudinal direction in which one or more of the effective areas are arranged along the longitudinal direction;
wherein:
at least in a central area of the longitudinal direction, the deposition mask is warped to be convex on the first surface in a cross section orthogonal to the longitudinal direction.

The deposition mask of the present disclosure, may further including a peripheral area surrounding the effective area,
wherein a value of a difference (D2−D1) between a distance D2 and a distance D1 may be larger than 0 mm and smaller than 0.05 mm, in which
out of one or more total pitch marks disposed on one side of the width direction of the effective area in the peripheral area, a total pitch mark closest to the central portion of the longitudinal direction is represented as a first total pitch mark,
out of one or more total pitch marks disposed on the other side of the width direction of the effective area in the peripheral area, a total pitch mark corresponding to the first total pitch mark is represented as a second total pitch mark,
a distance along the width direction between the first total pitch mark and the second total pitch mark is represented as D1 (mm) when the deposition mask is placed on a horizontal flat surface such that the first surface faces upward; and
a distance along the width direction between the first total pitch mark and the second total pitch mark is represented as D2 (mm) when the deposition mask is placed on a horizontal flat surface such that the first surface faces upward and the deposition mask is loaded from above so that the deposition mask is flattened.

In the deposition mask of the present disclosure,
a value of a difference (D2−D1) between the distance D2 and the distance D1 may be larger than 0 mm and smaller than 0.05 mm, in which
out of the one or more through holes located closest to an edge on one side of the width direction of the deposition mask, a through hole closest to the central portion of the longitudinal direction is represented as a first through hole,
out of the one or more through holes located closest to an edge on the other side of the width direction of the deposition mask, a through hole whose separation distance to the first through hole along the longitudinal direction is shortest is represented as a second through hole;
a distance along the width direction between the first through hole and the second through hole is represented as D1 (mm) when the deposition mask is placed on a horizontal flat surface such that the first surface faces upward; and
a distance along the width direction between the first through hole and the second through hole is represented as D2 (mm) when the deposition mask is placed on a horizontal flat surface such that the first surface faces upward and the deposition mask is loaded from above so that the deposition mask is flattened.

According to the present disclosure, when a deposition mask is brought into contact with a deposition target substrate, the deposition can be effectively prevented from getting wrinkled.

BRIEF DESCRIPTION OF THE DRAWINGS

FIG. 26 is a view for describing an example.

FIG. 27 is a view for describing an example.

DETAILED DESCRIPTION

Figure 1:
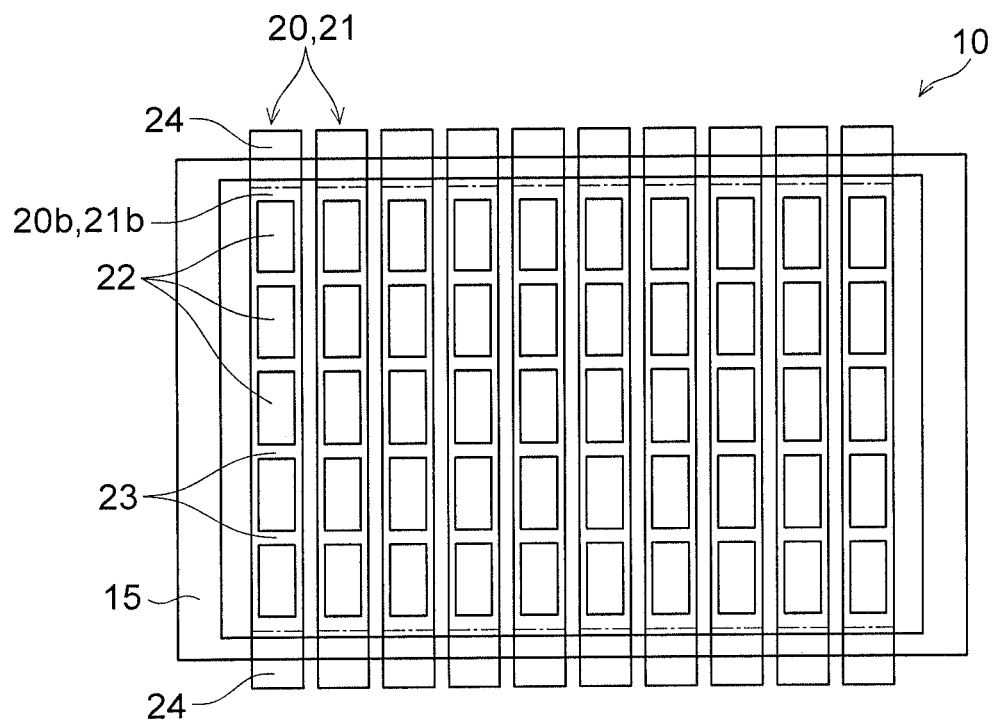
FIG. 1 is a view for describing an embodiment of the present disclosure, which is a schematic plan view showing an example of a deposition mask apparatus including deposition masks.

An embodiment of the present disclosure is described with reference to the drawings. In the drawings attached to the specification, a scale dimension, an aspect ratio and so on are changed and exaggerated from the actual ones, for the convenience of easiness in illustration and understanding.

FIGS. 1 to 25 are views for describing an embodiment of the present disclosure. In the below embodiment, a deposition mask that is used, when an organic EL display device is manufactured, for depositing an organic material (deposition material) onto an organic EL substrate (deposition target substrate/substrate onto which a deposition material is to be deposited) in a desired pattern to form a pattern, and a deposition method using the deposition mask are described by way of example. However, the present disclosure is not limited to this application, and can be applied to a deposition mask used for various purposes and to a deposition method using the deposition mask.

In this specification, the terms "substrate", "sheet" and "film" are not differentiated from one another, based only on the difference in terms. For example, the "plate" is a concept including a member that can be referred to as "sheet" or "film". Thus, "metal plate" is not differentiated from "metal sheet" and "metal film", based only on the difference in terms.

In addition, the term "plate plane (sheet plane, film plane)" means a plane corresponding to a plane direction of a plate-like (sheet-like, film-like) member as a target, when the plate-like (sheet-like, film-like) member as a target is seen as a whole in general. A normal direction used to the plate-like (sheet-like, film-like) member means a normal direction with respect to a plate plane (sheet surface, film surface) of the member.

Further, terms specifying shapes, geometric conditions and their degrees, e.g., terms such as "parallel", "orthogonal", "same", "equivalent" etc. and values of physical properties such as a length, an angle, etc., are not limited to their strict definitions, but should be construed to include a range capable of exerting a similar function.

Figure 2:
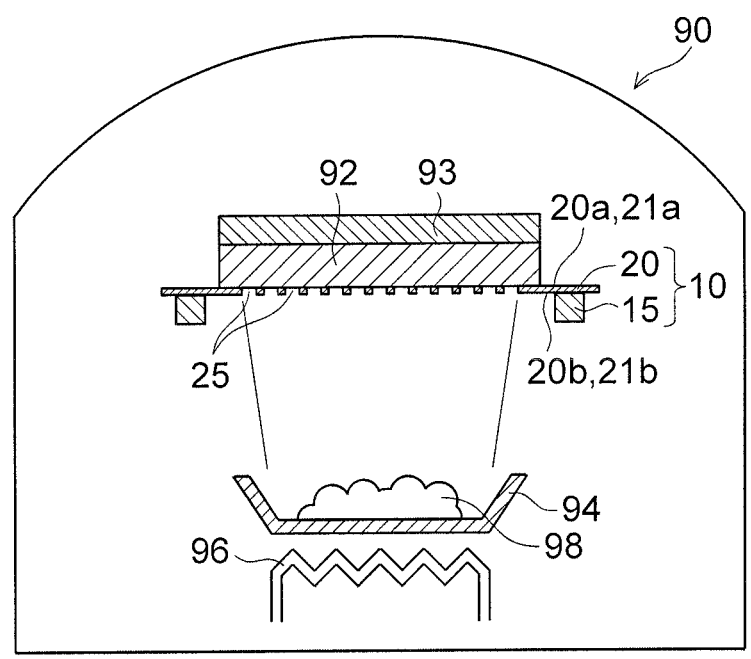
FIG. 2 is a view for describing a method for depositing a deposition material onto a deposition target substrate with the use of the deposition mask apparatus shown in FIG. 1.

An example of a deposition mask apparatus including a deposition mask is firstly described with reference to FIGS. 1 and 2. FIG. 1 is a plan view showing an example of a deposition mask apparatus in which deposition masks are incorporated. FIG. 2 is a view for describing a method of using the deposition mask apparatus shown in FIG. 1.

The deposition mask apparatus 10 shown in FIGS. 1 and 2 includes a plurality of deposition masks 20 formed of a substantially rectangular metal plate 21, and a frame 15 holding the deposition masks 20. Each deposition mask 20 has a first surface 20a and a second surface 20b that are opposed to each other, and the metal plate 21 has a first surface 21a and a second surface 21b that are opposed to each other. The first surface 21a of the metal plate 21 provides a part of the first surface 20a of the deposition mask 20, and the second surface 21b of the metal plate 21 provides a part of the second surface 20b of the deposition mask 20.

As shown in FIG. 1, the deposition mask 20 has a plurality of effective areas 22 that is arranged along its longitudinal direction, peripheral areas 23 surrounding the effective areas 22, and a pair of ear areas 24 that are positioned on end portions of the longitudinal direction of the deposition mask 20, with the effective areas 22 and the peripheral areas 23 being sandwiched therebetween. The deposition mask 20 is attached to the frame 15 at each ear area 24. Namely, the frame 15 is attached to the end portions of the longitudinal direction of the rectangular deposition mask 20. In the example shown in FIGS. 1 and 2, in order that the deposition masks 20 is not distorted, the frame 15 holds the deposition masks 20 such that the deposition masks 20 are suspended in their longitudinal direction, i.e., tension is generated in the longitudinal direction of the deposition masks 20. The deposition masks 20 and the frame 15 fixed to each other by spot welding, for example.

A plurality of through holes 25 are formed in the effective area 22 in a desired pattern. The through holes 25 are intended to pass a deposition material therethrough, when the deposition material is deposited onto a deposition target substrate, which is an object to be deposited. In the illustrated example, the through holes 25 are formed by etching the metal plate 21 at least from the side of the second surface 21b. As shown in FIG. 2, the deposition mask apparatus 10 is supported in a deposition apparatus 90 such that the first surfaces 20a of the deposition masks 20 (first surface 21a of the metal plate 21) face a lower surface of the deposition target substrate, i.e., an organic EL substrate 92, and the deposition masks 20 are used for depositing a deposition material onto the deposition target substrate. Thus, the first surface 20a of the deposition mask 20 provides a surface facing the deposition target substrate, and the second surface 20b provides a surface opposed to the first surface 20a.

In the deposition apparatus 90, the deposition masks 20 and the organic EL substrate 90 are brought into contact with each other by a magnetic force from the magnet 93. In the deposition apparatus 90, a crucible 94 containing a deposition material (e.g., organic luminescence material) 98, and a heater 96 for heating the crucible 94 are disposed below the deposition mask apparatus 10. The deposition apparatus 90 is decompressed into high vacuum, and then the deposition material 98 in the crucible 94 is evaporated or sublimated by heat from the heater 96 so as to adhere to the surface of the organic EL substrate 92. As described above, a plurality of the through holes 25 is formed in the deposition mask 20, so that the deposition material 98 adheres to the organic EL substrate 92 thorough the through holes 25. As a result, the deposition material 98 is deposited onto the surface of the organic EL substrate 92 in a desired pattern corresponding to the positions of the through holes 25 of the deposition mask 20.

As described above, in this embodiment, the through holes 25 are positioned in a desired pattern in each effective area 22 of the deposition mask 20. When colored display is desired, the deposition mask 20 (deposition mask apparatus 10) and the organic EL substrate 92 may be relatively moved to each other little by little along an arrangement direction (the aforementioned one direction) of the through holes 25, in order that an organic luminescence material for red color, an organic luminescence material for green color, and an organic luminescence material for blue color are deposited in sequence. In addition, the organic luminescence materials may be deposited onto the organic EL substrate 92, by using different deposition masks 20 having through holes 25 that are positioned in different patterns for the respective colors.

A deposition process is sometimes performed inside the deposition apparatus 90 in a high temperature atmosphere. In this case, during the deposition process, the deposition masks 20, the frame 15, and the organic EL substrate 92, i.e., a deposition target substrate, which are held inside the deposition apparatus 90, are also heated. At this time, each of the deposition masks 20, the frame 15 and the organic EL substrate develop dimensional change behaviors based on their respective thermal expansion coefficients. In this case, when the thermal expansion coefficients of the deposition mask 20, the frame 15 and the organic EL substrate 92 largely differ from one another, positioning displacement occurs because of the difference in dimensional change. As a result, the dimensional precision and the positional precision of the deposition material to be adhered to the organic EL substrate 92 lower. In order to solve this problem, the thermal expansion coefficients of the deposition mask 20 and the frame 15 are preferably equivalent to the thermal expansion coefficient of the organic EL substrate 92. For example, when a glass substrate is used as the organic EL substrate 92, an iron alloy containing nickel and cobalt can be used as a material of the deposition mask 20 (metal plate 21) and the frame 15. For example, the iron alloy containing not less than 30% by mass and not more than 54% by mass of nickel and cobalt in total, and not less than 0% by mass and not more than 6% by mass of cobalt can be used. Concrete examples of an iron alloy containing nickel or nickel and cobalt may be an invar material containing not less than 34% by mass and not more than 38% by mass of nickel, a super invar material containing cobalt in addition to not less than 30% by mass and not more than 34% by mass of nickel.

A thickness of the deposition mask 20 (metal plate 21) is not less than 10 μm and not more than 40 μm, for example. A thickness of a deposition mask reduces year by year in accordance with a higher pixel density. In the case where the thickness of the deposition mask 20 is not more than 40 μm, when the deposition mask 20 is brought into contact with the organic EL substrate 92 by a magnetic force of the magnet 93, the deposition mask 20 is sufficiently deformed even if the deposition mask 20 is curled by the effect of an internal stress. Thus, the contact of the deposition mask 20 to the organic EL substrate 92 can be improved. In addition, when the thickness of the deposition mask 20 is not less than 8 μm, the deformation of the deposition mask 20 can be effectively prevented during the handling of the deposition mask 20, to thereby improve a product throughput. In particular, when an iron alloy containing not less than 30% by mass and not more than 54% by mass of nickel and cobalt in total, and not less than 0% by mass and not more than 6% by mass of cobalt is used as a material of the deposition mask 20, the deposition mask 20 having a thickness of not less than 10 μm can more remarkably prevent the deformation of the deposition mask 20 during the handling of the deposition mask 20.

If the deposition mask 20, the frame 15 and the organic EL substrate 92 do not have a high temperature during the deposition process, it is not necessary that the thermal expansion coefficients of the deposition mask 20 and the frame 15 are equivalent to the thermal expansion coefficient of the organic EL substrate 92. In this case, a material other than the aforementioned iron alloy containing nickel can be used as a material for forming the deposition mask 20 (metal plate 21). For example, it is possible to use, as a material of the deposition mask 20 (metal plate 21), a so-called stainless material such as in iron alloy containing chrome, an iron alloy containing nickel and chrome. In addition, it is possible to use a metal material other than an iron alloy, such as nickel or nickel-cobalt alloy.

Figure 3:
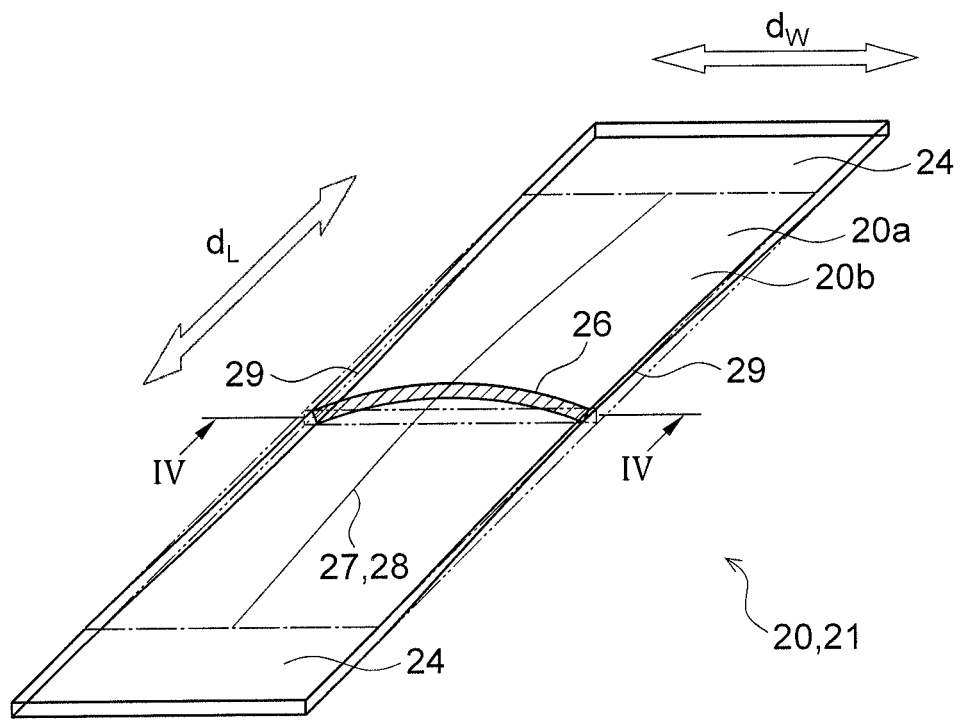
FIG. 3 is a perspective view showing the deposition mask shown in FIG. 1.
Figure 4:
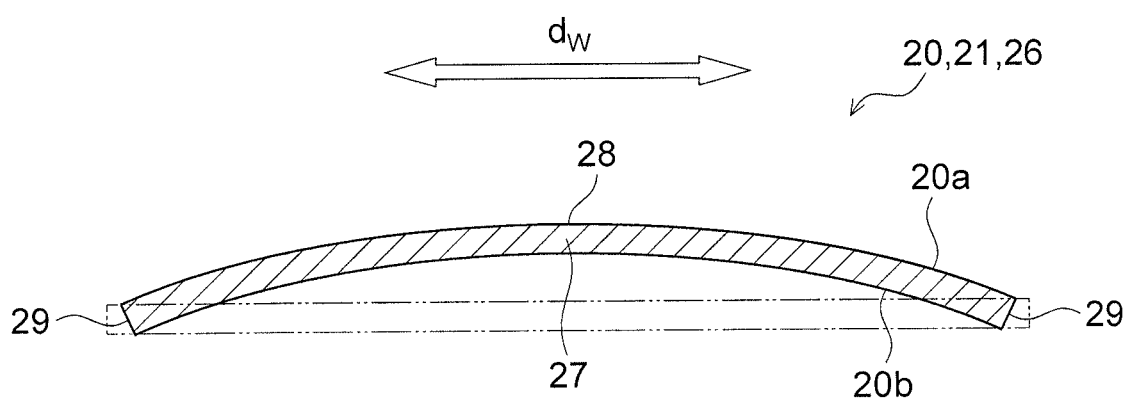
FIG. 4 is a view showing the deposition mask in a cross section corresponding to the IV-IV line in FIG. 3.
Figure 5:
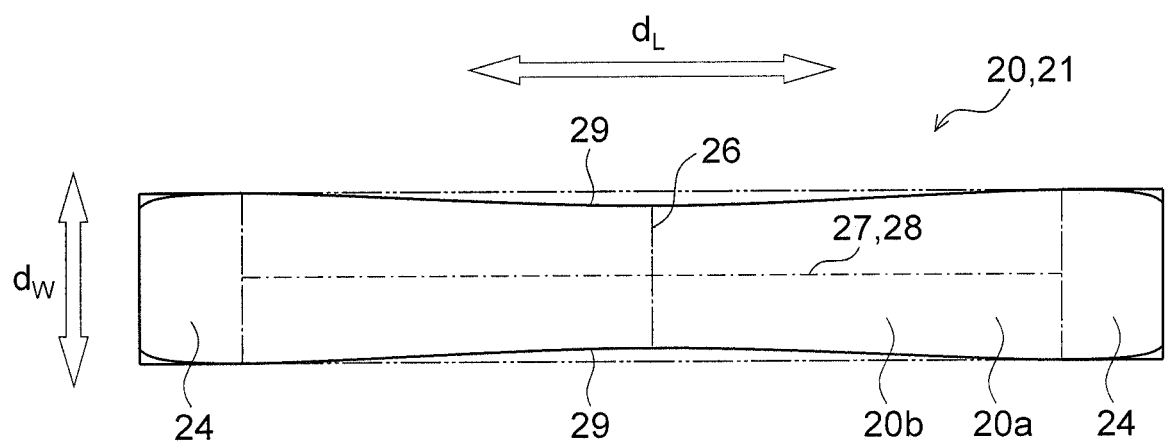
FIG. 5 is a plan view showing the deposition mask of FIG. 3.

Next, the deposition mask 20 is described with reference mainly to FIGS. 1 and 3 to 5. FIG. 3 is a perspective view showing the deposition mask 20 shown in FIG. 1. FIG. 4 is a view showing the deposition mask 20 in a cross section corresponding to the IV-IV line in FIG. 3. FIG. 5 is a plan view showing the deposition mask 20.

In this embodiment, the deposition mask 20 is formed of the metal plate 21, and has a substantially quadrangular profile when seen from the normal direction of the deposition mask 20 (metal plate 21), i.e., in a plan view, more precisely a substantially rectangular profile in a plan view. Particularly in the example shown in FIG. 3, the deposition mask 20 has, in a plan view, a substantially rectangular profile having a longitudinal direction $d_L$ and a width direction $d_W$ orthogonal to the longitudinal direction $d_L$. The metal plate 21 of the deposition mask 20 includes one or more effective area(s) 22 in which through holes 25 are formed in at regular intervals, a peripheral area 23 surrounding each effective area 22, and a pair of ear areas 24 that are positioned on both end portions of the longitudinal direction $d_L$ of the deposition mask 20 with the effective area 22 and the peripheral area 23 sandwiching therebetween.

The peripheral area 23 and the ear areas 24 are areas for supporting the effective area 22, and are not areas through which the deposition material intended to be deposited onto the deposition target substrate passes. For example, in the deposition mask 20 used for depositing an organic luminescence material for organic EL display device, the effective area 22 means a region on a deposition target substrate (organic EL substrate 92), onto which the organic luminescence material is deposited to form pixels, namely, an area of the deposition mask 20, which faces the region on the organic EL substrate 92 to provide a display surface of a manufactured organic EL display substrate. However, for various reasons, the peripheral area 23 and the ear areas 24 may have through holes and/or recesses. In this embodiment, each effective area 22 has a substantially quadrangular profile in a plan view, more precisely, a substantially rectangular profile in a plan view. Although not shown, each effective area 22 may have different profiles depending on a shape of a display area of an organic EL display device manufactured form the organic EL substrate 92. For example, each effective area 22 may have a circular profile.

In the example shown in FIG. 1, the deposition mask 20 has a plurality of the effective areas 22, and the respective effective areas 22 are aligned with predetermined intervals therebetween along one direction parallel to the longitudinal direction of the deposition mask 20. In the illustrated example, the organic EL substrate 92 is configured such that a plurality of organic EL display devices can be manufactured from the one organic EL substrate 92. Namely, a multiplicity of organic EL display devices can be manufactured from the organic EL substrate 92. In addition, in the illustrated example, one effective area 22 corresponds to one organic EL display device to be manufactured from the organic EL substrate 92. Thus, the deposition mask apparatus 10 (deposition mask 20) shown in FIG. 1 enables a multifaceted deposition to the organic EL substrate 92.

The deposition mask 20 in this embodiment is warped to be convex on the first surface 20a in a cross section orthogonal to the longitudinal direction $d_L$, at least in a central portion of the longitudinal direction $d_L$. The central portion of the longitudinal direction $d_L$ of the deposition mask 20 means an area having a predetermined length along the longitudinal direction $d_L$ including a center 26 of the longitudinal direction $d_L$ of the deposition mask 20. In particular, the center 26 of the longitudinal direction $d_L$ of the deposition mask 20 and a center of the central portion of the longitudinal direction $d_L$ correspond to each other. Thus, the center of the central portion of the longitudinal direction $d_L$ is also depicted by the reference numeral 26. In addition, the predetermined length of the central portion along the longitudinal direction $d_L$ may be ½ of the length of the effective area 22 along the longitudinal direction $d_L$. The fact that at least in a central area of the longitudinal direction $d_L$, the deposition mask 20 is warped to be convex on the first surface 20a in a cross section orthogonal to the longitudinal direction $d_L$ means that the deposition mask 20 is warped to be convex on the first surface 20a in any cross section orthogonal to the longitudinal direction $d_L$, which is included in the central portion of the longitudinal direction $d_L$. Particularly in the example shown in FIG. 3, at least in the center 26 of the longitudinal direction $d_L$, the deposition mask 20 is warped to be convex on the first surface 20a, in a cross section orthogonal to the longitudinal direction $d_L$.

The fact that the deposition mask 20 is warped to be convex on the first surface 20a means a state in which, when the deposition mask 20 is placed on a horizontal flat surface 52 such that the first surface 20a faces upward, both edges 29 of the second surface 20b in the width direction $d_W$ are in contact with the flat surface 52, while a central portion 27 of the second surface 20b in the width direction $d_W$ is not in contact with the flat surface 52, as described later with reference to FIG. 11. In other words, it means that a gap G is formed between the second surface 20b of the deposition mask 20 and the flat surface 52, other than the locations of both edges 29 of the width direction $d_W$ in the second surface 20b.

In the example shown in FIG. 3, the deposition mask 20 is warped to be convex on the first surface 20a in a cross section orthogonal to the longitudinal direction $d_L$, over the entire area on which the effective area 22 is disposed, including the central portion of the longitudinal direction $d_L$. In other words, the deposition mask 20 is warped such that the entire area sandwiched between the pair of ear areas 24 projects to the side of the first surface 20a in a cross section orthogonal to the longitudinal direction $d_L$. In the illustrated example, the ear areas 24 of the deposition mask 20 are not warped and have a flat shape as a whole. However, not limited thereto, at least a part of the ear area 24 of the deposition mask 20 may be warped. For example, a part of the central portion of the longitudinal direction $d_L$ in the ear area 24 may be warped to be convex on the first surface 20a in a cross section orthogonal to the longitudinal direction $d_L$. The fact that a part is warped to be convex on the first surface 20a means that the first surface 20a of the deposition mask 20 provides an outside surface of the curve of the deposition mask 20, while the second surface 20b provides an inside surface of the curve of the deposition mask 20. In FIGS. 3 to 5, a shape of a deposition mask, which is not warped and has a flat shape as a whole, is shown by two-dot chain lines, for comparison with the deposition mask 20 in this embodiment.

In the example shown in FIG. 3, the central portion of the longitudinal direction $d_L$ of the deposition mask 20 is most largely warped in a cross section orthogonal to the longitudinal direction $d_L$. Namely, the central portion of the longitudinal direction $d_L$ of the deposition mask 20 has the largest curvature in a cross section orthogonal to the longitudinal direction $d_L$. In other words, the central portion of the longitudinal direction $d_L$ of the deposition mask 20 has the smallest radius of curvature in a cross section orthogonal to the longitudinal direction $d_L$. In the illustrated example, in the area of the deposition mask 20, which is sandwiched between the pair of ear areas 24, a curvature factor of the curve in a cross section orthogonal to the longitudinal direction $d_L$ gradually increases from an end portion of each ear area 24 toward the central portion of the longitudinal direction $d_L$. In particular, in the area of the deposition mask 20, which is sandwiched between the pair of ear areas 24, a curvature factor of the curve in a cross section orthogonal to the longitudinal direction $d_L$ increases continuously from an end portion of each ear area 24 toward the central portion of the longitudinal direction $d_L$.

When the deposition mask 20 is placed such that its first surface 20a faces upward and its second surface 20b faces downward, in the example shown in FIG. 3, in an area of the deposition mask 20, which is sandwiched between the pair of ear area 24, in all the area from the end portion on the side of the one ear area 24 up to the end portion on the side of the other ear area 24, the central portion 27 of the deposition mask 20 in the width direction $d_W$ is the highest in a cross section orthogonal to the longitudinal direction $d_L$. In accordance therewith, in the area sandwiched between the pair of ear areas 24 in the first surface 20a of the deposition mask 20, a ridge line 28 to which the central portion 27 of the width direction $d_W$ of the deposition mask 20 is continuous is formed from the end portion on the side of the one ear area 24 up to the end portion on the side of the other ear area 24. The ridge line 28 extends along the longitudinal direction $d_L$ above the central portion 27 of the width direction $d_W$ of the deposition mask 20. Particularly in the illustrated example, the ridge line 28 linearly extends parallel to the longitudinal direction $d_L$, above the central portion 27 of the width direction $d_W$ of the deposition mask 20.

FIG. 4 shows a cross section of the central portion of the longitudinal direction $d_L$ of the deposition mask 20, the cross section being orthogonal to the longitudinal direction $d_L$. In the illustrated example, the deposition mask 20 is curved to the side of the second surface 20 from the central portion 27 of the width direction $d_W$ toward the both edges 29, 29 of the width direction $d_W$. Thus, the deposition mask 20 is warped to be convex on the first surface 20a, in other words, the deposition mask 20 is warped to dent toward the side of the second surface 20b. Particularly in the illustrated example, the deposition mask 20 is curved only to the side of the second surface 20b from the central portion 27 of the width direction $d_W$ toward both edges 29, 29 of the width direction $d_W$. In particular, the deposition mask 20 is curved continuously to the side of the second surface 20b form the central portion 27 of the width direction $d_W$ toward both edges 29, 29 of the width direction $d_W$.

FIG. 5 shows the deposition mask 20 in a plan view. Since the deposition mask 20 is warped to be convex on the first surface 20a, in a plan view, the width of the deposition mask 20 along the width direction $d_W$ varies along the longitudinal direction $d_L$. In the illustrated example, in the area sandwiched between the pair of ear areas 24 in the deposition mask 20, the width of the deposition mask 20 along the width direction $d_W$ varies to narrow from the end portion on the side of each ear area 24 toward the central portion of the longitudinal direction $d_L$. Particularly in the illustrated example, the width of the deposition mask 20 in the width direction $d_W$ varies only to narrow from the end portion on the side of each ear area 24 toward the central portion of the longitudinal direction $d_L$. In more detail, in the illustrated example, the width of the deposition mask 20 along the width direction $d_W$ continuously varies to narrow from the end portion on the side of each ear area 24 toward the central portion of the longitudinal direction $d_L$. As a result, the width of the deposition mask 20 along the width direction $d_W$ in the central portion of the longitudinal direction $d_L$ is narrower than the width of the deposition mask 20 along the width direction $d_W$ in the end portion on the side of each ear areas 24 of the area sandwiched between the pair of ear areas 24. In particular, the width of the deposition mask 20 along the width direction $d_W$ in the central portion of the longitudinal direction $d_L$ is the narrowest width in the area sandwiched between the pair of ear areas 24 in the deposition mask 20.

Thus, by evaluating the width along the width direction $d_W$ of the deposition mask 20 in the central portion of the longitudinal direction $d_L$, a warp degree of the deposition mask 20 in the central portion of the longitudinal direction $d_L$ can be evaluated therefrom. Namely, when the width along the width direction $d_W$ of the deposition mask 20 in the central portion of the longitudinal direction $d_L$ is evaluated to be small, the warp of the deposition mask 20 in the central portion of the longitudinal direction $d_L$ can be evaluated to be large (a curvature factor of the curve is large, a radius of curvature of the curve is small). On the other hand, when the width along the width direction $d_W$ of the deposition mask 20 in the central portion of the longitudinal direction $d_L$ is evaluated to be large, the warp of the deposition mask 20 in the central portion of the longitudinal direction $d_L$ can be evaluated to be small (a curvature factor of the curve is small, a radius of curvature of the curve is large). A concrete method of evaluating the width along the width direction $d_W$ of the deposition mask 20 in the central portion of the longitudinal direction $d_L$ is described later.

In a conventional deposition mask, a plurality of through holes is formed by half-etching a metal plate at least from the side of a second surface. A metal plate is manufactured by rolling a metal material. In general, a stress remains in a rolled metal plate along its plate thickness direction. Thus, when a deposition mask is manufactured from a rolled metal plate, the conventional technique performs, after the rolling step, an annealing step in which the metal plate is held at a predetermined temperature for a predetermined time, before a half etching step for forming through holes, in order that a stress remaining in the metal plate is reduced. Preferably, a stress remaining in the metal plate is reduced down to zero. Thus, a deposition mask manufactured from a conventional metal plate is free from warp, and the deposition mask generally has a flat shape.

In this embodiment, for example, the holding temperature and/or holding time of the below-described metal plate 64 is adjusted in the annealing step before the half etching step, a stress remaining in the metal plate 64 is allowed to remain therein at a desired amount. At this time, because of the half-etching of the metal plate 64 from a second surface 64$b$, a part in which the remaining metal amount is large (side of the first surface 64$a$), and a part in which the remaining metal amount is small (side of the second surface 64$b$) are generated in the plate thickness direction of the metal plate 64. Thus, there occurs a difference in remaining stress between the side of the first surface 64$a$ of the metal plate 64 and the side of the second surface 64$b$ thereof. Accordingly, the deposition mask 20 formed of the metal plate 21 manufactured by cutting the metal plate 64 can be warped to be convex on the first surface 20$a$, in a cross section orthogonal to the longitudinal direction $d_L$, at least in the central portion of the longitudinal direction $d_L$.

Figure 6:
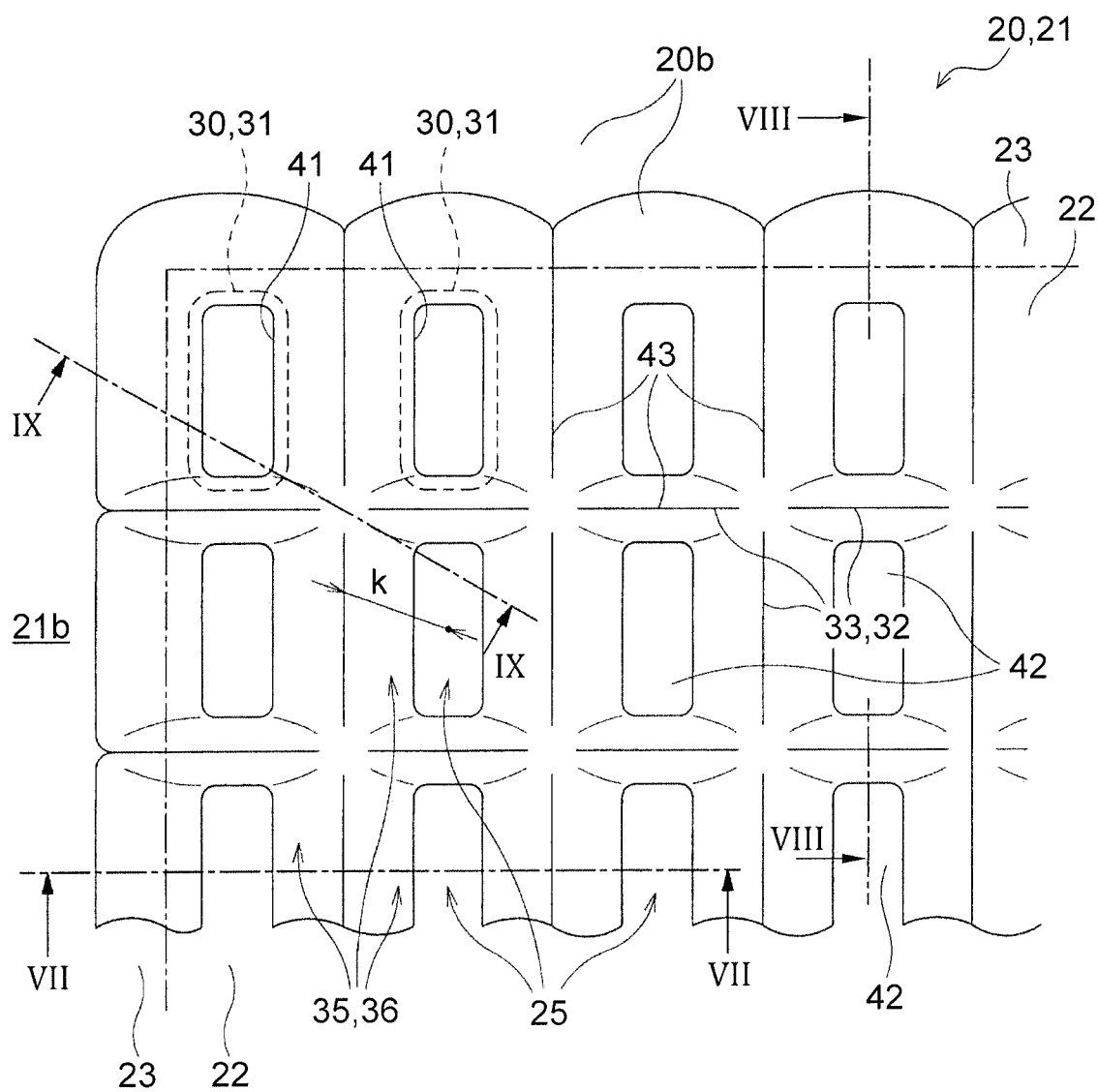
FIG. 6 is a partial plan view showing the deposition mask shown in FIG. 1.
Figure 7:
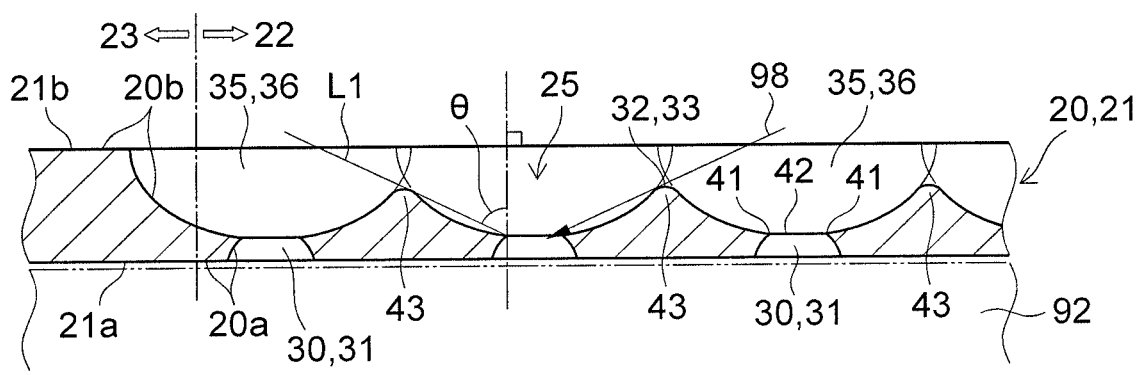
FIG. 7 is a sectional view along the VII-VII line of the deposition mask of FIG. 6.
Figure 8:
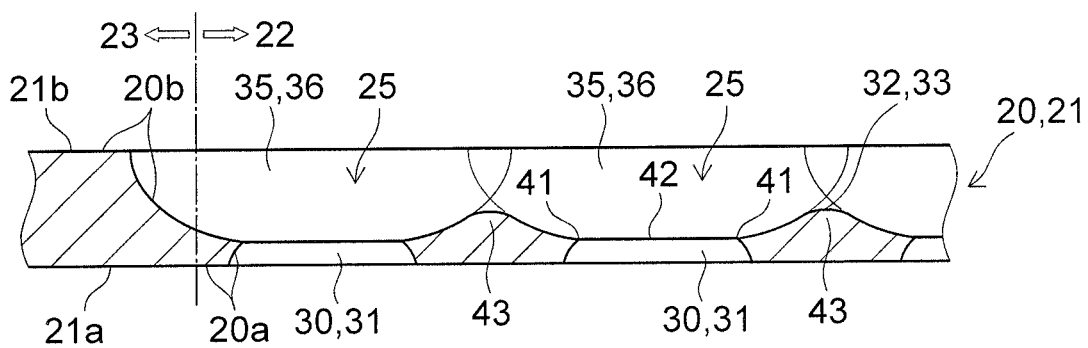
FIG. 8 is a sectional view along the VIII-VIII line of the deposition mask of FIG. 6.
Figure 9:
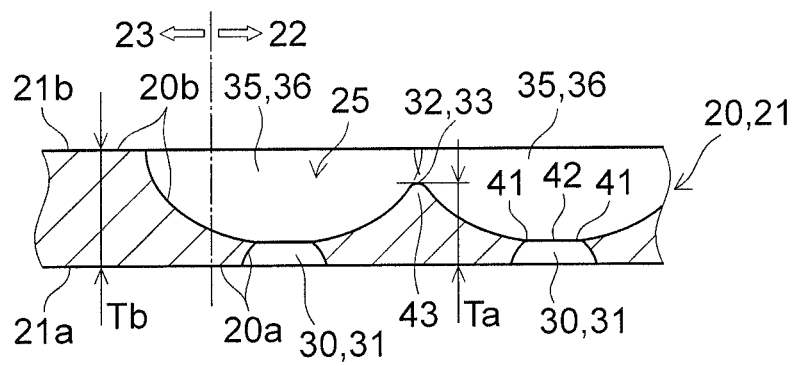
FIG. 9 is a sectional view along the IX-IX line of the deposition mask of FIG. 6.

Next, an example of a plurality of the through holes 25 formed in each effective area 22 of the deposition mask 20 is described in detail with reference mainly to FIGS. 6 to 9. FIG. 6 is a partial plan view showing the deposition mask 20 shown in FIG. 1. FIG. 7 is a sectional view along the VII-VII line of the deposition mask 20 of FIG. 6. FIG. 8 is a sectional view along the VIII-VIII line of the deposition mask 20 of FIG. 6. FIG. 9 is a sectional view along the IX-IX line of the deposition mask 20 of FIG. 6. In the example shown in FIG. 6, the plurality of through holes 25 formed in each effective area 22 of the deposition mask 20 are arranged, in the effective area 22, at predetermined pitches along two direction orthogonal to each other.

As shown in FIGS. 7 to 9, the plurality of through holes 25 extend between the first surface 20$a$, which is on one side along the normal direction of the deposition mask 20, and the second surface 20$b$, which is on the other side along the normal direction of the deposition mask 20, to pass through the deposition mask 20. In the illustrated example, as described in detail below, first recesses 30 are formed in the metal plate 21 by etching the metal plate 21 from the side of the first surface 21$a$ of the metal plate 21, which is on one side in the normal direction of the deposition mask 20, and second recesses 35 are formed in the metal plate 21 by etching the metal plate 21 from the second surface 21$b$, which is on the other side in the normal direction of the metal plate 21. Each through hole 25 is formed by the first recess 30 and the second recess 35.

As shown in FIGS. 6 to 9, a sectional area of each first recess 30, which is in a cross section along a plate plane of the deposition mask 20 at respective positions along the normal direction of the deposition mask 20, gradually decreases from the side of the first surface 20$a$ of the deposition mask 20 to the side of the second surface 20$b$ thereof. In the illustrated example, a wall surface 31 of the first recess 30 extends, in the whole area thereof, in a direction crossing the normal direction of the deposition mask 20, and is exposed toward one side along the normal direction of the deposition mask 20. Similarly, in the illustrated example, a sectional area of each second recess 35, which is in a cross section along the plate plane of the deposition mask 20 at respective positions along the normal direction of the deposition mask 20, gradually decreases from the side of the second surface 20$b$ of the deposition mask 20 to the side of the first surface 20$a$ thereof. A wall surface 36 of the second recess 35 extends, in the whole area thereof, in the direction crossing the normal direction of the deposition mask 20, and is exposed toward the other side along the normal direction of the deposition mask 20.

As shown in FIGS. 7 to 9, the wall surface 31 of the first recess 30 and the wall surface 36 of the second recess 35 are connected through a circumferential connection portion 41. The connection portion 41 is defined by a ridge line of a bulging part where the wall surface 31 of the first recess 30, which is inclined with respect to the normal direction of the deposition mask 20, and the wall surface 36 of the second recess 35, which is inclined with respect to the normal direction of the deposition mask 20, are merged with each other. The connection portion 41 provides a through portion 42 where an area of the through hole 25 is minimum in a plan view of the deposition mask 20.

As shown in FIGS. 7 to 9, two through holes 25 that are adjacent in the one side surface along the normal direction of the deposition mask 20, i.e., in the first surface 20$a$ of the deposition mask 20, are spaced apart from each other along the plate plane of the deposition mask 20. Namely, as in the below-described manufacturing method, when the first recesses 30 are made by etching the metal plate 21 from the side of the first surface 21$a$ of the metal plate 21, which will correspond to the first surface 20$a$ of the deposition mask 20, the first surface 21$a$ of the metal plate 21 remains between the adjacent two first recesses 30.

On the other hand, as shown in FIGS. 7 to 9, on the other side along the normal direction of the deposition mask 20, i.e., on the side of the second surface 20$b$ of the deposition mask 20, the adjacent two second recesses 35 are connected.

Namely, as described in the below manufacturing method, when the second recesses 35 are formed by etching the metal plate 21 from the side of the second surface 21b of the metal plate, which will correspond to the second surface 20b of the deposition mask 20, no second surface 21b of the metal plate 21 remains between the adjacent two second recesses 35. Namely, the second surface 21b of the metal plate 21 is etched over the whole area of the effective area 22. Due to the second surface 20b of the deposition mask 20 formed by such second recesses 35, when the deposition mask 20 is used such that the second surface 20b of the deposition mask 20 faces the deposition material 98, as shown in FIG. 2, utilization efficiency of the deposition material 98 can be effectively improved.

When the deposition mask apparatus 10 is accommodated in the deposition apparatus 90 as shown in FIG. 2, the second surface 20b of the deposition mask 20 is positioned on the side of the crucible 94 holding the deposition material 98 as shown by the two-dot chain lines in FIG. 7, while the first surface 20a of the deposition mask 20 faces the organic EL substrate 92. Thus, the deposition material 98 adheres to the organic EL substrate 92 through the second recess 35 whose sectional area gradually decreases. The deposition material 98 not only moves from the crucible 94 toward the organic EL substrate 92 along the normal direction of the organic EL substrate 92, but also sometimes moves along a direction largely inclined with respect to the normal direction of the organic EL substrate 92, as shown by the arrow in FIG. 7. At this time, when the thickness of the deposition mask 20 is large, most of the diagonally moving deposition material 98 arrives at the wall surface 36 of the second recess 35 to adhere thereto, before the deposition material 98 passes through the through-holes 25 to arrive at the organic EL substrate 92. For example, most of the diagonally moving deposition material 98 adheres to a portion near the connection portion 41 of the wall surface 36 and a portion near a distal edge 32 thereof. In this case, in an area on the organic EL substrate 92, which faces the through holes 25, there are areas at which the deposit material 98 is easy to arrive, and areas at which the deposition material 98 is difficult to arrive. Thus, in order to improve utilization efficiency of the deposition material 98 (film deposition efficiency: a ratio of the deposition material 98 that adheres to the organic EL substrate 92) so as to save an expensive deposition material and to stably perform a film deposition using an expensive deposition material uniformly in a desired area, it is important to configure the deposition mask 20 such that the diagonally moving deposition material 98 can arrive at the organic EL substrate 92 as much as possible. In the cross sections of FIGS. 7 to 9 that are orthogonal to the plate plane of the deposition mask 20, it is advantageous to sufficiently enlarge a minimum angle θ (see FIG. 7) which is defined by a line L1, which passes the connection portion 31 having the minimum sectional area of the through hole 25 and another given position of the wall surface 36 of the second recess 35, with respect to the normal direction of the deposition mask 20.

As a method of enlarging the angle θ, it can be considered that the thickness of the deposition mask 20 is reduced so that the heights of the wall surface 36 of the second recess 35 and the wall surface 31 of the first recess are increased. Namely, as the metal plate 21 for constituting the deposition mask 20, a metal plate 21 having a small thickness as much as possible is preferably used, as long as the strength of the deposition mask 20 is ensured.

As another method of enlarging the angle θ, it can be considered to optimize the profile of the second recess 35. For example, according to this embodiment, since the wall surfaces 36 of adjacent two second recesses 35 are merged, the angle θ can be remarkably enlarged (see FIG. 7), as compared with a case in which a recess having a wall surface (profile) that is not merged with another recess, which are shown by broken lines. The reason therefor is described below.

As described in more detail below, the second recesses 35 are formed by etching the second surface 21b of the metal plate 21. A wall surface of the recess formed by etching has generally a curved shape that projects to the erosion direction. Thus, the wall surface 36 of the recess formed by etching is steep in an area on the etching start side, and is relatively largely inclined with respect to the normal direction of the metal plate 21 in an area opposed to the etching start side, i.e., the deepest side of the recess. On the other hand, in the illustrated deposition mask 20, since the wall surfaces 36 of the adjacent two second recesses 35 are merged on the etching start side, an outer profile of a portion 43 at which the distal edges 32 of the wall surfaces 36 of the second recesses 35 has not a steep shape but a chamfered shape. Thus, the wall surface 36 of the second recess 35, which provides a large part of the through hole 25, can be effectively inclined with respect to the normal direction of the deposition mask 20. Namely, the angle θ can be enlarged.

According to the deposition mask 20 in this embodiment, in the whole area of the effective area 22, the inclination angle θ, which is defined by the wall surface 36 of the second recess 35 with respect to the normal direction of the deposition mask 20 can be effectively increased. Thus, deposition in a desired pattern can be stably, precisely perfume, while effectively improving the utilization efficiency of the deposition material 98.

As described in the below manufacturing method, when the second recesses 35 are manufactured by etching the metal plate 21 from the second surface 21b of the metal plate 21, which corresponds to the second surface 20b of the deposition mask 20, in the whole area of the metal plate 21, which forms the effective area 22 of the deposition mask 20, the second surface 21b of the metal plate 21 is eroded by etching. Namely, in the effective area 22, there is no second surface 21b of the metal plate 21. In other words, a maximum thickness Ta along the normal direction in the effective area 22 of the deposition mask 20 is less than 100% of a maximum thickness Tb along the normal direction in the peripheral area 23 of the deposition mask 20. The fact that the thickness in the effective area 22 is reduced as a whole is preferred from the viewpoint of improving the utilization efficiency of the deposition material. On the other hand, from the viewpoint of strength of the deposition mask 20, the maximum thickness Ta along the normal direction in the effective area 22 of the deposition mask 20 has a predetermined ratio or more with respect to the maximum thickness Tb along the normal direction in the peripheral area 23 of the deposition mask 20. This is because, when the deposition mask 20 is suspended on the frame 15, the deformation of the deposition mask 20 in the effective area 22 can be effectively prevented, so that deposition in a desired pattern can be effectively performed.

In addition, since the width of the second recess 35 widens from the one side toward the other side along the normal direction of the deposition mask 20, a ridge line 33 is formed by merging the distal edge 32 of the wall surface 36 of the second recess 35 and the distal edge 32 of the wall surface 36 of another second recess 35. In the illustrated example, the through holes 25 have a substantially rectangular shape in a plan view, and are arranged at predetermined pitches respectively in the two directions orthogonal to each other. Thus, as shown in FIG. 6, the distal edge 32 of the wall surface 36 of the second recess 35, which provides a through hole 25 that is positioned in the effective area 22 other than an outermost thereof extends along the substantially rectangular shape, and the ridge lines extending between the adjacent two second recesses 35 extend in two directions respectively parallel to the arrangement directions of the through holes 25.

Further, as described in the below manufacturing method, when the second recesses 35 are formed by etching, a position of the distal edge 32 of the wall surface 36 of the second recess 35, which is merged with the distal edge 32 of the wall surface 36 of another second recess 35, is not constant but changes. Because of the below-described method of forming the second recesses 35, a height of the distal edge 32 changes depending on a distance from the through portion 42 of the through hole 25, at which the depth of the second recess 35 is largest, along the plate plane of the deposition mask 20. To be specific, a height of the distal edge 32 of the wall surface 36 of the second recess 35, which is merged with the distal edge 32 of the wall surface 36 of another second recess 35, along the normal direction of the deposition mask 20 is generally higher, when a distance from the through portion 42 of the through hole 25 up to the distal edge 32 thereof, which is defined by the second recess 35, along the plate plane of the deposition mask is longer. Thus, as shown in FIG. 6, when the through holes 25 (second recesses 35) are arranged in square matrices, the height of the distal edge 32 is highest at a position intermediate of the through holes 254 adjacent in the respective two arrangement directions.

In general, as can be particularly understood from FIG. 8, in such a deposition mask 20, the height of the distal edge 32 of the wall surface 36 of the second recess 35 is lower, when a distance k (see FIG. 6) in a plan view from a position of this distal edge 32 up to the center of an area (in this example, through portion 42) through the metal plate 21 in a plan view of the through hole 25 defined by the second recess 35 is shorter. Thus, the aforementioned angle θ can be effectively increased. As a result, deposition in a desired pattern can be stably, precisely perfume, while effectively improving the utilization efficiency of the deposition material 98.

Further, in the illustrated example, because of the below-described manufacturing method, the outer profile (the line forming the outer shape of the merged portion 43 in the cross section) of the portion 43 at which the distal edges 32 of the wall surfaces 36 of the two second recesses 35 are merged has a chamfered shape in a cross section along the normal direction of the deposition mask 20. As described above, a wall surface of a recess formed by etching has generally a curved shape that projects to the main etching direction. Thus, when the two second recesses 35 formed by etching are simply overlapped with each other partially, as shown by the broken lines in FIGS. 7 to 9, the merged portion 43 has a shape pointed toward the other side along the normal direction of the deposition mask 20, which is the etching start side. On the other hand, in the illustrated deposition mask 20, the pointed portion of the merged portion 43 has a chamfered shape. As can be understood from FIGS. 7 to 9, due to the chamfered shape, the aforementioned angle θ, which is defined by the wall surface 36 of the second recess 35 with respect to the normal direction of the deposition mask 20 can be effectively increased. Thus, deposition in a desired pattern can be stably, precisely perfume, while effectively improving the utilization efficiency of the deposition material 98.

Next, a method of evaluating a width of the deposition mask 20, which is along the width direction $d_W$ of the deposition mask 20 in the central portion of the longitudinal direction $d_L$, is described with reference to FIGS. 10 to 12. In the illustrated example, as a dimension corresponding to the width along the width direction $d_W$ of the deposition mask 20 in the central portion of the longitudinal direction $d_L$, a distance near the central portion of the longitudinal direction $d_L$, along the width direction $d_W$ between two reference points 45 that are spaced apart in the width direction $d_W$ of the deposition mask 20 is used so as to evaluate the width along the width direction $d_W$ of the deposition mask 20 in the central portion of the longitudinal direction $d_L$.

Figure 10:
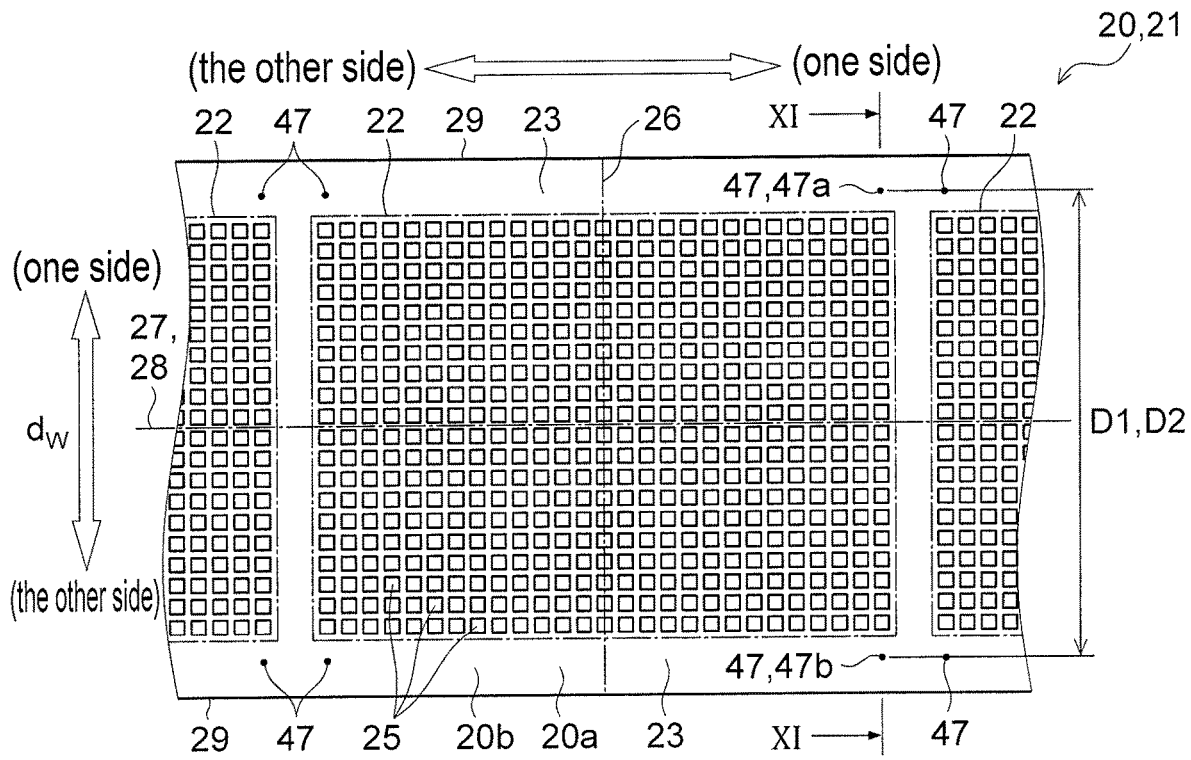
FIG. 10 is a partial plan view showing the deposition mask of FIG. 5, in particular, a view for describing an example of a reference point of the deposition mask.

In the example shown in FIG. 10, total pitch marks 47 are disposed in the peripheral area 23 in the central portion of the longitudinal direction $d_L$ of the deposition mask 20. Two total pitch marks 47 of these total pitch marks 47, which are spaced apart in the width direction $d_W$, are used as reference points 45, and a distance between the two total pitch marks 47 along the width direction $d_W$ is measured. The total pitch mark is a mark provided for evaluating positional precision of the plurality of through holes 25 in the deposition mask 20, and is generally provided outside the effective area 22, i.e., provided in the peripheral area 23. In the illustrated example, the total pitch marks 47 corresponding to the effective area 22 are provided in the peripheral area 23 outside the width direction $d_W$ of respective through holes 25 positioned at four corners of the effective area 22 in which a plurality of through holes 25 is included. Thus, in the illustrated example, four total pitch marks 47 are provided per effective area 22.

Out of one or more total pitch marks 47 disposed on one side of the width direction $d_W$ of the effective area 22, a total pitch mark 47 closest to the central portion of the longitudinal direction $d_L$, is represented as a first total pitch mark 47a. Out of one or more total pitch marks 47 disposed on the other side of the width direction $d_W$ of the effective area 22, a total pitch mark 47 which is positioned on the other side of the width direction $d_W$ with respect to the first total pitch mark 47a, i.e., the total pitch mark 47 corresponding to the first total pitch mark 47a is represented as a second total pitch mark 47b. In the example shown in FIG. 10, the first total pitch mark 47a is used as one reference point 45 of the two reference points 45, and the second total pitch mark 47b is used as the other reference pint 45 of the two reference points 45.

When the odd number of effective areas 22 are disposed along the longitudinal direction $d_L$ of the deposition mask 20, as shown in FIG. 10, one effective area 22 is disposed on the central portion of the longitudinal direction $d_L$. In this case, in the plurality of total pitch marks 47 corresponding to the effective area 22 positioned on the center of the longitudinal direction $d_L$, out of one or more total pitch marks 47 disposed on one side of the width direction $d_W$ of the effective area 22, the first total pitch mark 47a, which is closest to the central portion of the longitudinal direction $d_L$, is used as one reference point 45 of the two reference points 45, and the second total pitch mark 47b corresponding to the first total pitch mark 47a is used as the other reference point 45 of the two reference points 45.

Figure 11:
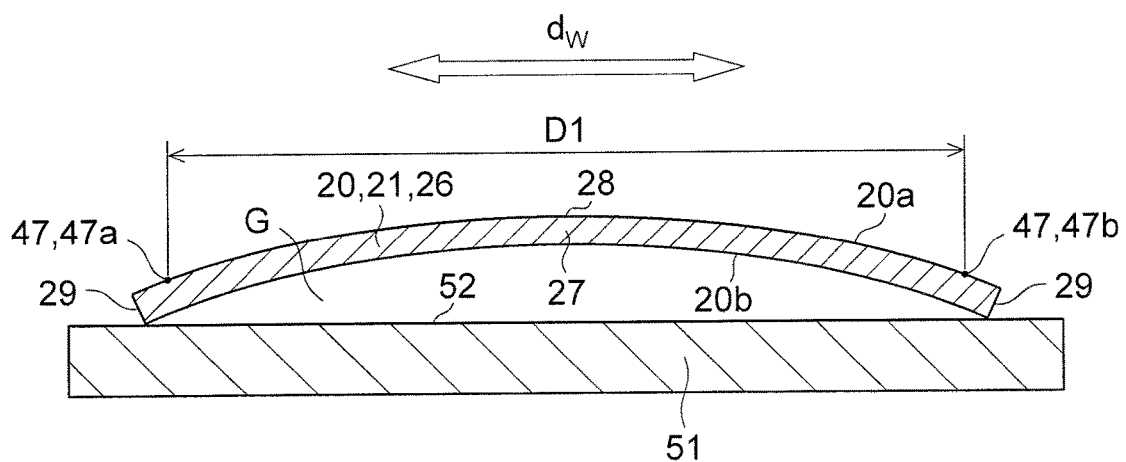
FIG. 11 is a view for describing a method for measuring a distance between two reference points of FIG. 10.

As shown in FIG. 11, the deposition mask 20 is placed on a table 51 such that the first surface 20a faces upward. An upper surface of the table 51 provides a horizontal flat surface 52. FIGS. 11 and 12 show the deposition mask 20 in a cross section corresponding to the Xi-XI line of FIG. 10. In the example shown in FIG. 11, the deposition mask 20 is warped to be convex on the first surface 20a in this cross section. Thus, in the illustrated example, the deposition mask 20 is in contact with the flat surface 52 at both edges 29 of the width direction $d_W$ in the second surface 20b. The central portion 27 of the width direction $d_W$ in the second surface 20b is not in contact with the flat surface 52. Thus, in the illustrated example, a gap G is formed between the second surface 20b of the deposition mask 20 and the flat surface 52, other than the locations of both edges 29 of the width direction $d_W$ in the second surface 20b. At this time, a distance along the width direction $d_W$ between the total pitch marks 47a, 47b (reference points 45), which are spaced apart in the width direction $d_W$ of the deposition mask 20, is represented as D1 (mm). A method of measuring the distance D1 is not limited, and the distance D1 may be optically measured from above with the use of an automatic two-dimensional coordinate measuring machine AMIC1710D manufactured by SINTO S-PRECISION, LTD.

Figure 12:
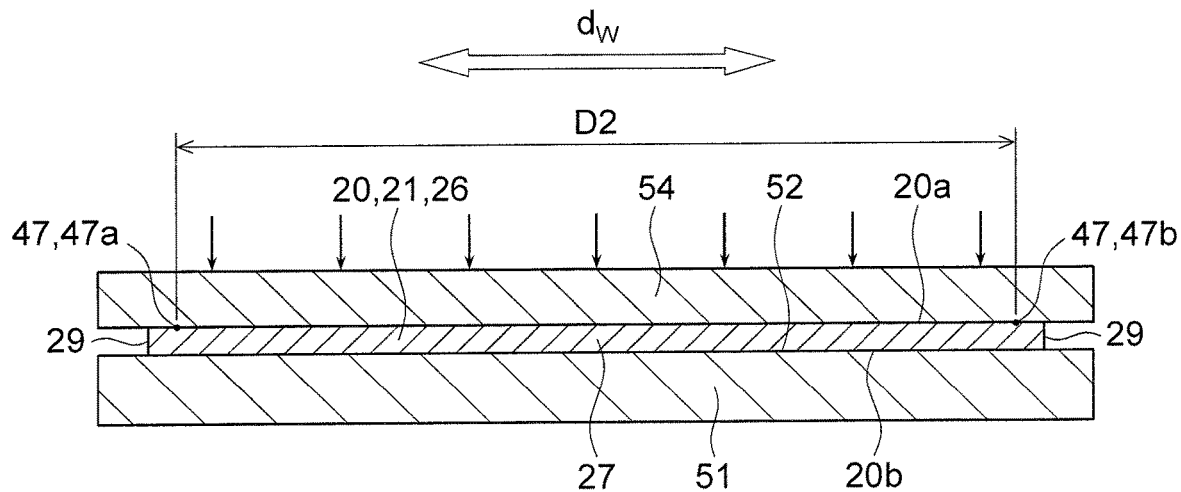
FIG. 12 is a view for describing a method for measuring a distance between two reference points of FIG. 10.

In addition, as shown in FIG. 12, the deposition mask 20 is placed on the horizontal flat surface 52 such that the first face 20a faces upward, and the deposition mask 20 is loaded from above so that the deposition mask 20 is flattened. In the illustrated example, a transparent glass plate 54 is placed from above on the deposition mask 20 placed on the flat surface 52. The glass plate 54 is loaded from above, so that the warped deposition mask 20 is unwarped and flattened. At this time, a distance along the width direction $d_W$ between the total pitch marks 47a, 47b (reference points 45), which are spaced apart in the width direction $d_W$ of the deposition mask 20, is represented as D2 (mm). The distance D2 can be measured by using the same method as the distance D1. In particular, the distance D2 can be optically measured through the glass plate 54.

Based on a value of difference (D2−D1) between the distance D2 and the distance D1, a warp degree of the central portion of the longitudinal direction $d_L$ of the deposition mask 20, in a cross section orthogonal to the longitudinal direction $d_L$ can be evaluated. As described above with reference to FIGS. 3 to 5, the deposition mask 20 is warped to be convex on the first surface 20a of at least the central portion of the longitudinal direction $d_L$, in a cross section orthogonal to the longitudinal direction $d_L$. Thus, the width along the width direction $d_W$, in the central portion of the longitudinal direction $d_L$ of the deposition mask 20, is smaller than the width of the deposition mask 20 that is not warped, i.e., that is flattened. Thus, the smaller a value (D2−D1) is, the smaller as the degree of warp of the deposition mask 20 can evaluated. The larger a value (D2−D1) is, the larger as the degree of warp of the deposition mask 20 can be evaluated.

A value (D2−D1) is preferably larger than 0 mm and smaller than 0.05 mm. When a value (D2−D1) is larger than 0 mm, as described below with reference to FIGS. 23 to 25, the first surface 20a of the deposition mask 20 can be brought into contact with a deposition target substrate sequentially from the center portion 27 (ridge line 28) of the width direction $d_W$ of the deposition mask 20 toward the edges 29 of the width direction $d_W$. Thus, when the deposition mask 20 is brought into contact with a deposition target substrate, the deposition mask 20 can be effectively prevented from getting wrinkled. On the other hand, when a value (D2−D1) is smaller than 0.05 mm, adhesion of the deposition mask 20 to a deposition target substrate by a magnetic force of the magnet 93 can be improved.

Even when the warp degrees are the same, when the dimensions of the deposition masks 20 differ, in particular, the widths of the deposition masks 20 along the width direction $d_W$ differ, values (D2−D1) may differ. For example, even when the warp degrees are the same, the deposition mask 20 having a larger width has a larger value (D2−D1). The present inventors have conducted extensive studies on a warp degree of the deposition mask 20 and a value (D2−D1), and found as follows. As in this embodiment, when the deposition mask 20 is placed on the horizontal flat surface 52 such that the first face 20a faces upward, the larger the dimension of the mask 20, in particular, the larger the width of the deposition mask 20 along the width direction $d_W$ is, the smaller the warp of deposition mask 20 is because of its own weight. Thus, a value (D2−D1) is smaller as compared with the value before the deposition mask 20 is placed on the flat surface 52. As a result, when the warp degrees are the same, values (D2−D1) take similar values regardless of the dimensions of the deposition mask 20. Thus, it was found that, by a simple method in which the distance D1 and the Distance D2 are measured and a value (D2−D1) is calculated, a warp degree of the deposition mask 20, at the central portion of the longitudinal direction $d_L$ of the deposition mask 20, in a cross section orthogonal to longitudinal direction $d_L$, could be evaluated to a certain precision degree.

As a method of measuring a warp of the deposition method 20, at the central portion of the longitudinal direction $d_L$ of the deposition mask 20, in a cross section orthogonal to the longitudinal direction $d_L$, a method in which the deposition mask 20 is cut in the central portion of the longitudinal direction $d_L$, at a plane orthogonal to the longitudinal direction $d_L$, and the cut surface is directly measured, and a method in which a three-dimensional measuring machine is used, and a distance between the three-dimensional measuring machine and the first surface 20a of the deposition mask 20 is measured along the width direction $d_W$ of the deposition mask 20, could be considered, for example. However, in the method for directly measuring the cut surface, it is difficult that the thinned deposition mask 20 is cut without deforming it, i.e., without changing its warp amount. In the method using the three-dimensional measuring machine, it is not necessary to cut the deposition mask 20, but the three-dimensional measuring machine is need, where by a measuring apparatus for measuring a warp of the deposition mask 20 as a whole has a complex and enlarged structure, resulting in increase in cost. On the other hand, as in this embodiment, according to the evaluation method in which the distances D1 and D2 along the width direction $d_W$ between the two reference points 45 which are spaced apart in the width direction $d_W$ of the deposition mask 20, in he central portion of the longitudinal direction $d_L$, and a warp degree is evaluated based on a value (D2−D1), it is not necessary to cut the deposition mask 20, and a warp degree of the deposition mask 20 can be evaluated by using a simple measuring apparatus. Thus, the evaluation method of a warp of the deposition mask 20 in this embodiment greatly contributes to improvement in evaluation precision and evaluation speed of a warp of the deposit mask 20, and downhold of cost for evaluation.

Figure 23:
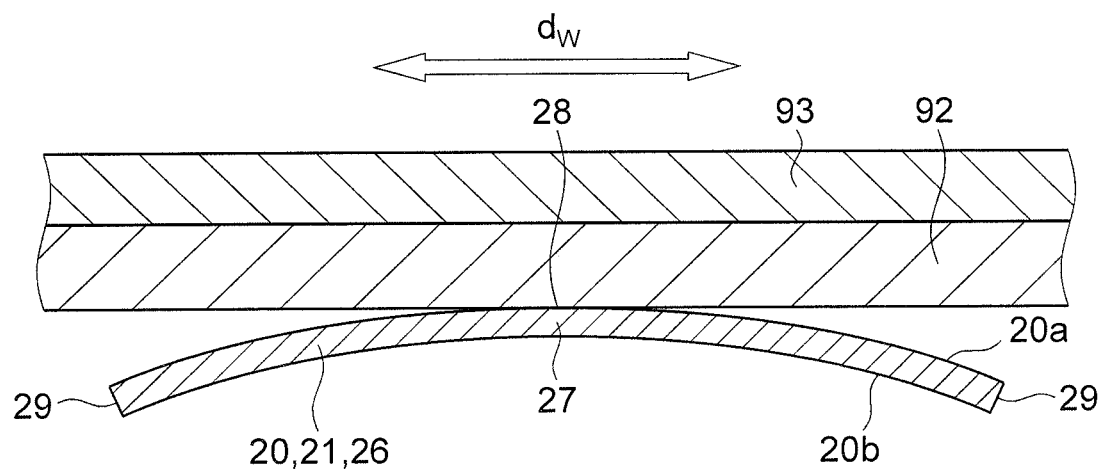
FIG. 23 is a view showing a state in which a deposition mask is brought into contact with a deposition target substrate.

In this embodiment, as described below with reference to FIGS. 23 to 25, in a step in which the deposition mask 20 is brought into contact with a deposition target substrate (organic EL substrate 92), when the deposition mask 20 is brought close to the organic EL substrate 92 from below, the central portion 27 (ridge line 28) of the width direction $d_W$ of the first surface 20a of the deposition mask 20 is firstly withdrawn to the organic EL substrate 92 by a magnetic force from the magnet 93, so as to come into contact with the lower surface of the organic EL substrate 92. Thereafter, the first surface 20a of the deposition mask 20 comes into contact with the lower surface of the organic EL substrate 92 sequentially from the central portion 27 of the width direction $d_W$ of the deposition mask 20 toward the edges 29 of the width direction $d_W$. At this time, since both edges 29 of the width direction $d_W$ of the deposition mask 20 are not in contact with the lower surface of the organic EL substrate 92, there is no possibility that the movement of the deposition mask 20 in the plate plane direction of the organic EL substrate 92 is prevented by a frictional force between the edges 29 and the lower surface of the organic EL substrate 92. Finally, the first surface 20a in the edges 29 of the width direction $d_W$ of the deposition mask 20 is brought into contact with the lower surface of the organic EL substrate 92. Thus, the whole first surface 20a of the deposition mask 20 is in contact with the lower surface of the organic EL substrate 92, without getting wrinkled.

On the other hand, in a case where a deposition mask is warped to be convex on the second surface, in a cross section orthogonal to the longitudinal direction in the central portion of the longitudinal direction of the deposition mask, i.e., the deposition mask is warped to dent to the side of the first surface, in a step in which the deposition mask is brought into contact with a deposition target substrate, when the deposition mask is brought close to the organic EL substrate from below, the edges of the width direction of the first surface of the deposition mask are firstly withdrawn to the organic EL substrate by a magnetic force from a magnet, so as to come into contact with the lower surface of the organic EL substrate. Then, by a magnetic force from the magnet, the central portion of the width direction adjacent to the edges of the width direction of the deposition mask is withdrawn to the organic EL substrate, so as to come into contact with the lower surface of the organic EL substrate. The first surface of the deposition mask comes into contact with the lower surface of the organic EL substrate sequentially from the edges of the width direction of the deposition mask toward the central portion of the width direction. At this time, since both edges of the width direction of the deposition mask have been already in contact with the lower surface of the organic EL substrate, the movement of the deposition mask in the plate plane direction of the organic EL substrate is prevented by a frictional force between the edges and the lower surface of the organic EL substrate. Thus, slight undulations, which have been generated when the deposition mask is suspended along the longitudinal direction, remain particularly in a part near the central portion of the width direction of the deposition mask, and the deposition mask may get wrinkled.

Thus, even if a value (D2−D1) is larger than 0 mm and smaller than 0.05 mm, when a deposition mask is warped to dent to the side of the first surface in a cross section orthogonal to the longitudinal direction in the central portion of the longitudinal direction of the deposition mask, it is impossible to obtain the effect in which the deposition mask 20 will not get wrinkled in a step in which the deposition mask 20 is brought into contact with a deposition target substrate, unlike this embodiment. In order to evaluate whether a deposition mask is warped to be convex on the first surface, a three-dimensional observation is not necessarily needed. For example, in a two-dimensional observation, it is possible to judge whether the upper surface of the deposition mask is convex or concave, at a focal point in an observation by means of a scope of a two-dimensional coordinate measuring machine or a microscope.

Another example of setting two reference points 45 of the deposition mask 20 is described with reference to FIGS. 13 to 15.

Figure 13:
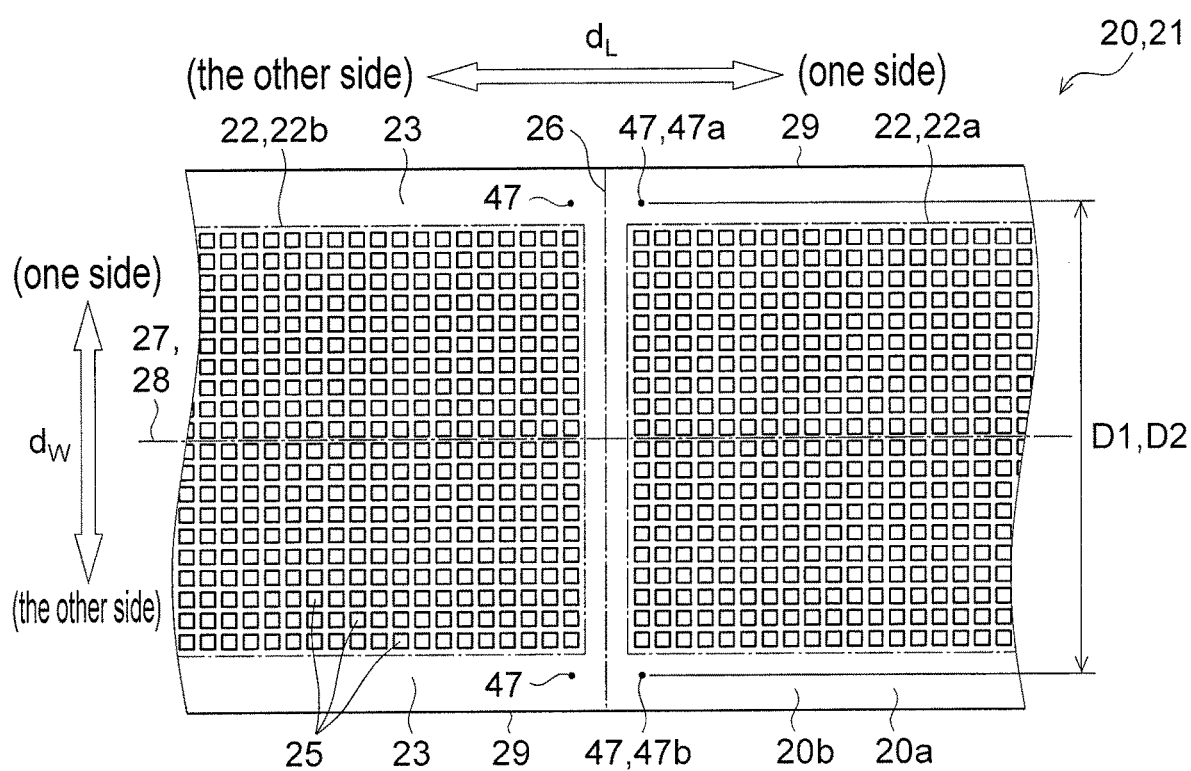
FIG. 13 is a view for describing another example of the reference point of the deposition mask.

When the even number of effective areas 22 are disposed along the longitudinal direction $d_L$ of the deposition mask 20, as shown in FIG. 13, two effective areas 22 are disposed along the longitudinal direction $d_L$, with the central portion of the longitudinal direction $d_L$ being sandwiched therebetween. In this case, in the plurality of total pitch marks 47 corresponding to the effective area 22a positioned on one side of the longitudinal direction $d_L$ with respect to the central portion of the longitudinal direction $d_L$ and the plurality of total pitch marks 47 corresponding to the effective area 22b positioned on the other side of the longitudinal direction $d_L$, out of the plurality of total pitch marks 47 positioned on one side of the width direction $d_W$ of the effective areas 22a, 22b, a total pitch mark 47 closest to the central portion of the longitudinal direction $d_L$ is represented as a first total pitch mark 47a. The first total pitch mark 47a is used as one reference point 45 of the two reference points, and a second total pitch mark 47b corresponding to the first total pitch mark 47a is used as the other reference point 45 of the two reference points 45.

In addition, predetermined through holes 25 of the plurality of through holes 25 included in the effective area 22 can be used as the two reference points 45. In this case, out of one or more through holes 25 located closest to the edge 29 on one side of the width direction $d_W$ of the deposition mask 20, a through hole 25 closest to the central portion of the longitudinal direction $d_L$ is represented as a first through hole 25a. In addition, out of one or more through holes 25 located closest to the edge 29 on the other side of the width direction $d_W$ of the deposition mask 20, a through hole 25 whose separation distance to the first through hole 25a along the longitudinal direction $d_L$ is shortest is represented as a second through hole 25b. The first through hole 25a is used as one reference point 45 of the two reference points 45, and the second through hole 25b is used as the other reference pint 45 of the two reference points 45.

Figure 14:
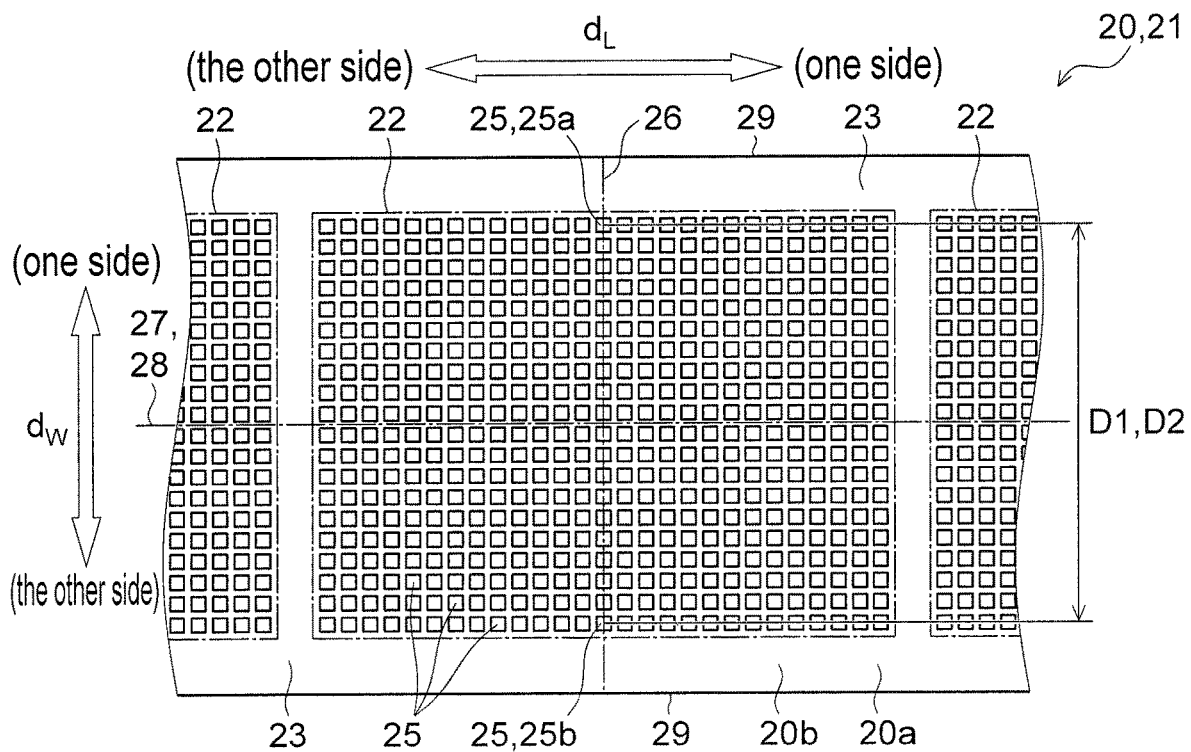
FIG. 14 is a view for describing yet another example of the reference point of the deposition mask.

When the odd number of effective areas 22 are disposed along longitudinal direction $d_L$ of the deposition mask 20, as shown in FIG. 14, out of one or more through holes 25 located closest to the edge 29 on one side of the width direction $d_W$ of the deposition mask 20, in the plurality of through holes 25 included in the effective area 22 positioned on the center of the longitudinal direction $d_L$, a through hole 25 closest to the central portion of the longitudinal direction $d_L$ can be represented as a first through hole 25a. In addition, out of one or more through holes 25 located closest to the edge 29 on the other side of the width direction $d_W$ of the deposition mask 20, in the plurality of through holes 25 included in this effective area 22, a through hole 25 whose separation distance to the first through hole 25a along the longitudinal direction $d_L$ is shortest can be represented as a second through hole 25b.

When the deposition mask 20 has only one effective area 22, i.e., when the deposition mask 20 has a single effective area, the deposition mask 20 can be considered to have only the central effective area 22 along the longitudinal direction $d_L$ in FIGS. 10 and 14.

Figure 15:
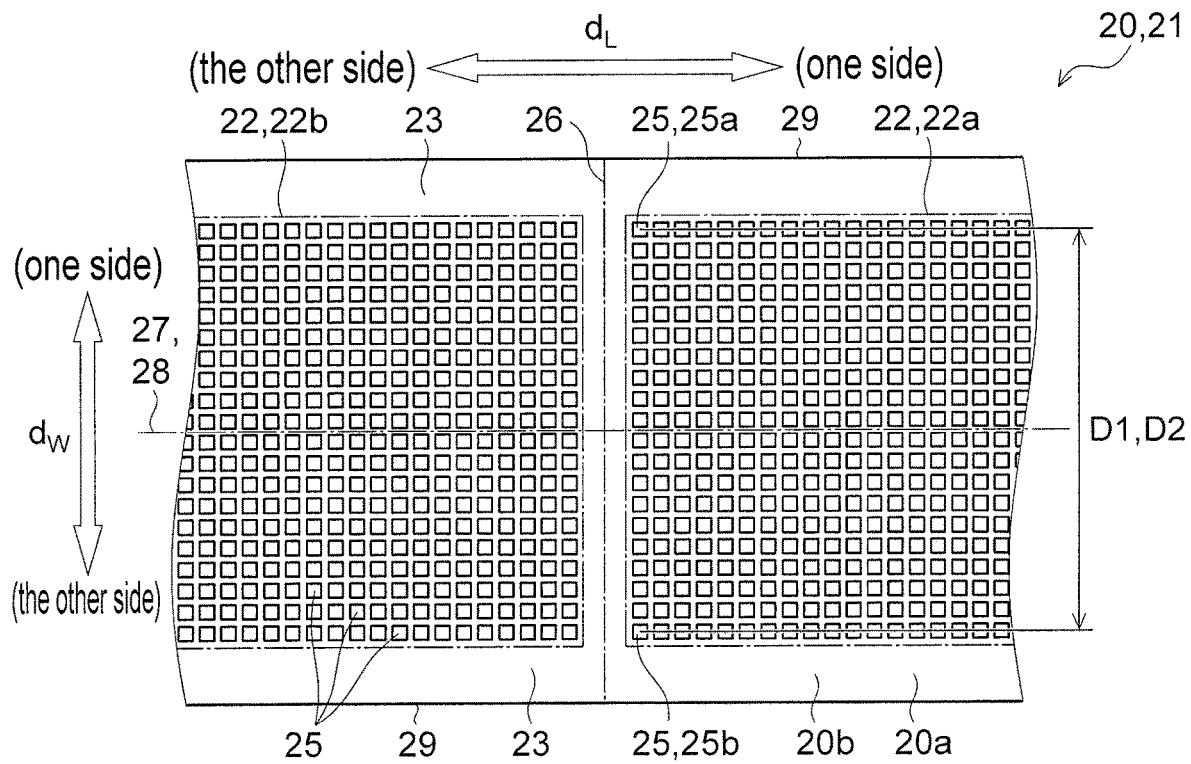
FIG. 15 is a view for describing yet another example of the reference point of the deposition mask.

When the even number of effective areas 22 are disposed along the longitudinal direction $d_L$ of the deposition mask 20, as shown in FIG. 15, out of the plurality of through holes 25 located closest to the edge 29 on one side of the width direction $d_W$ of the deposition mask 20, in the plurality of through holes 25 included in the effective area 22a positioned on one side of the longitudinal direction $d_L$ with respect to the central portion of the longitudinal direction $d_L$ and the plurality of through holes 25 included in the effective area 22b positioned on the other side, a through hole 25 closest to the central portion of the longitudinal direction $d_L$ can be represented as a first through hole 25a. In addition, out of one or more through holes 25 closet to the edge 29 on the other side, a through hole 25 whose separation distance to the first through hole 25a along the longitudinal direction $d_L$ can be represented as a second through hole 25b.

Measurement of the distances D1 and D2 along the width direction $d_W$ between the two reference points 45, in the examples shown in FIGS. 13 to 15, can be performed by a method similar to the measuring methods of the distances D1 and D2 described with reference to FIGS. 10 to 12.

Next, an example of a method of manufacturing such a deposition mask 20 is described with reference to FIGS. 16 to 22.

In this embodiment, the deposition mask 20 is manufactured by the metal plate 21 by a step in which an elongated metal plate 64 having a first surface 64a and a second surface 64b and extending like a strip is supplied, a step in which the metal plate 64 is etched by using a photolithographic technique so as to form the first recesses 30 in the metal plate 64 from the side of the first surface 64a, a step in which the formed first recesses 30 are sealed, a step in which the metal plate 64 is etched by using a photolithographic technique so as to form the second recesses 35 in the metal plate 64 from the side of the second surface 64b, and a step in which the metal plate 64 is cut into the sheet-like metal plates 21. Since the first recess 30 and the second recess 35 formed in the metal plate 64 communicate to each other, each through hole 25 is formed in the metal plate 64. Herebelow, the respective steps are described in detail.

Figure 16:
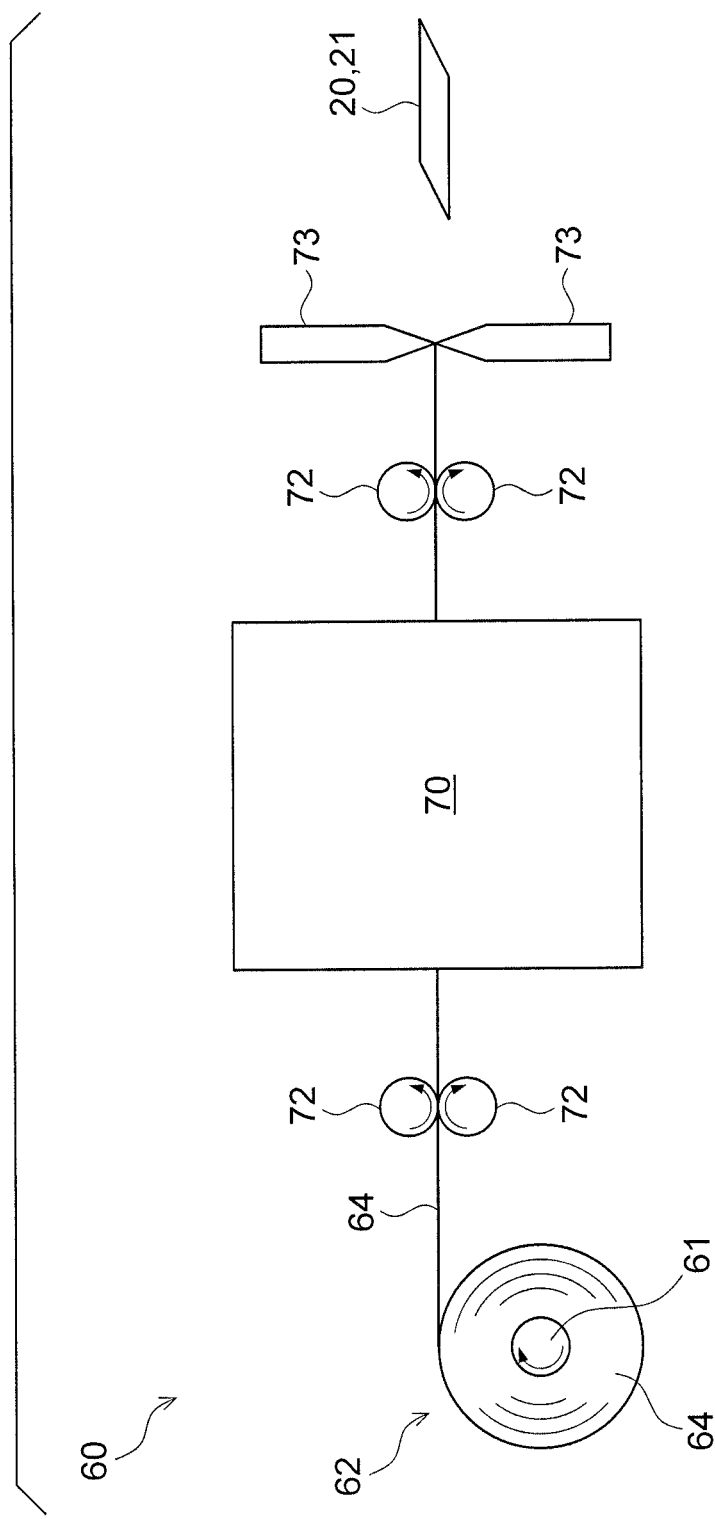
FIG. 16 is a schematic view for generally describing an example of a manufacturing method of the deposition mask shown in FIG. 1.

FIG. 16 shows a manufacturing apparatus 60 for producing the deposition mask 20. As shown in FIG. 16, a roll 62 having a core 61 around which the elongated metal plate 64 is wound is firstly prepared. In the roll 62, the elongated metal plate 64 is wound around the core 61 such that its leading end side along the longitudinal direction is outside and that its trailing end side comes close to the core 61. By rotating the core 61 to reel out the roll 62, the metal plate 64 extending like a strip is supplied. The metal plate 64 is cut in the succeeding step to provide the sheet-like metal plates 21, and further the deposition masks 20. As a material of the metal plate 64, an iron alloy containing not less than 30% by mass and not more than 54% by mass of nickel and cobalt in total, and not less than 0% by mass and not more than 6% by mass of cobalt can be used. Concrete examples of an iron alloy containing nickel or nickel and cobalt may be an invar material containing not less than 34% by mass and not more than 38% by mass of nickel, a super invar material containing cobalt in addition to not less than 30% by mass and not more than 34% by mass of nickel. The metal plate 64 is manufactured by rolling a metal material. In an annealing step succeeding to the rolling step, the metal plate 64 is held at a predetermined temperature for a predetermined time, so that a stress remaining in the metal plate 64 is reduced. In this embodiment, in the annealing step, by adjusting the holding temperature and/or the holding time of the metal plate 64, a stress remaining in the metal plate 64 is allowed to remain therein at a desired amount. A thickness of the metal plate 64 may be not less than 10 μm and not more than 40 μm, for example. The supplied metal plate 64 is conveyed by a conveyor roller 72 to a processing apparatus 70. The respective processes shown in FIGS. 17 to 22 are performed by the processing apparatus 70.

Figure 17:
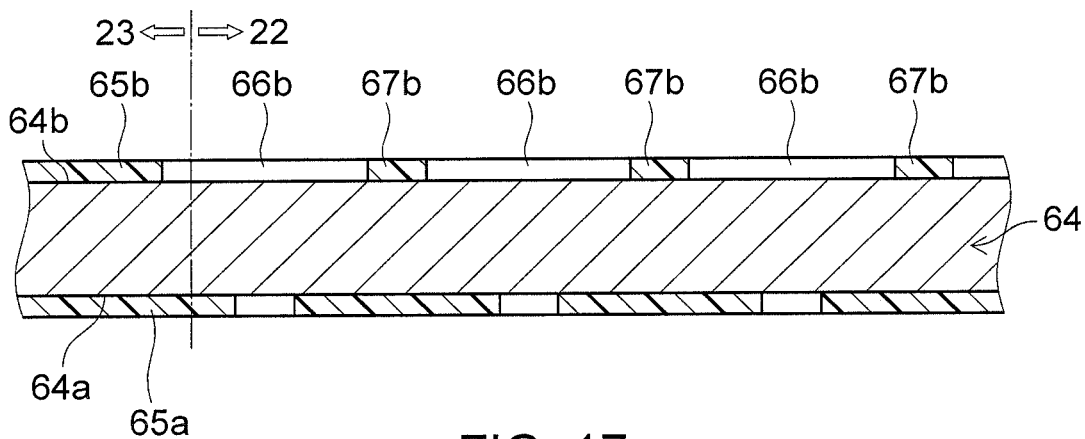
FIG. 17 is a view for describing an example of a manufacturing method of a deposition mask.

Firstly, as shown in FIG. 17, a first resist pattern 65a is formed on the first surface 64a of the metal plate 64, and a second resist pattern 65b is formed on the second surface 64b of the metal plate 64. For example, a negative type resist pattern is formed as follows. Firstly, a photosensitive resist material is applied to the first surface 64a (on the lower surface in the sheet plane of FIG. 17) and the second surface 64b of the metal plate 64, so as to form resist films on the metal plate 64. Then, glass dry plates, which do not allow light to transmit through the areas to be removed from the resist films, are prepared, and the glass dry plates are disposed on the resist films. Thereafter, the resist films are exposed through the glass dry plates, and further the resist films are developed. In this manner, the first resist pattern 65a can be formed on the first surface 64a of the metal plate 64, and the second resist pattern 65b can be formed on the second surface 64b of the metal plate 64.

Figure 18:
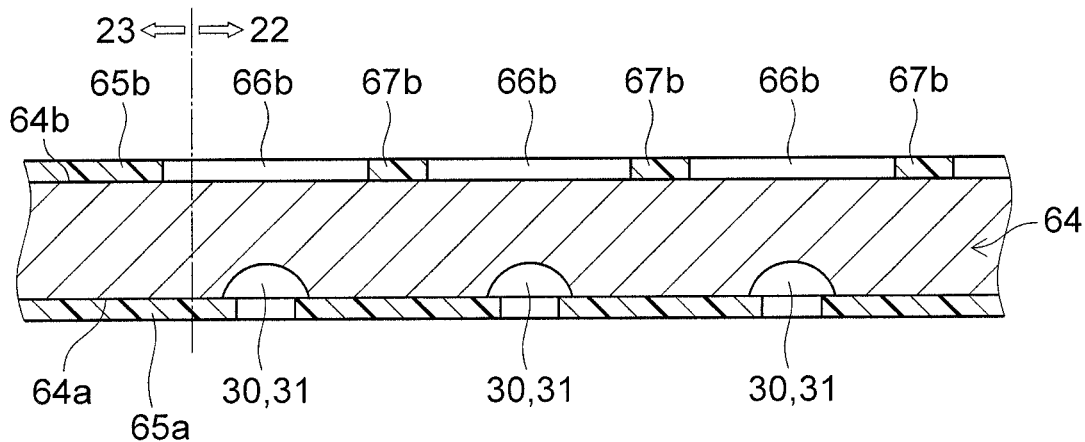
FIG. 18 is a view for describing the example of the manufacturing method of a deposition mask.

Then, as shown in FIG. 18, by using an etchant (e.g., ferric chloride solution), the metal plate 64 is etched from the side of the first surface 64a with the first resist pattern 65a formed on the metal plate 64 serving as a mask (first etching). For example, the etchant is jetted to the first surface 64a of the metal plate 694 across the first resist pattern 65a, from a nozzle disposed on the side facing the first surface 64a of the conveyed metal plate 64. As a result, as shown in FIG. 18, the areas of the metal plate 64, which are not covered with the first resist pattern 65a, are eroded by the etchant. Thus, a plurality of first recesses 30 each having a wall surface 31 is formed in the metal plate 64 from the side of the first surface 64a.

Figure 19:
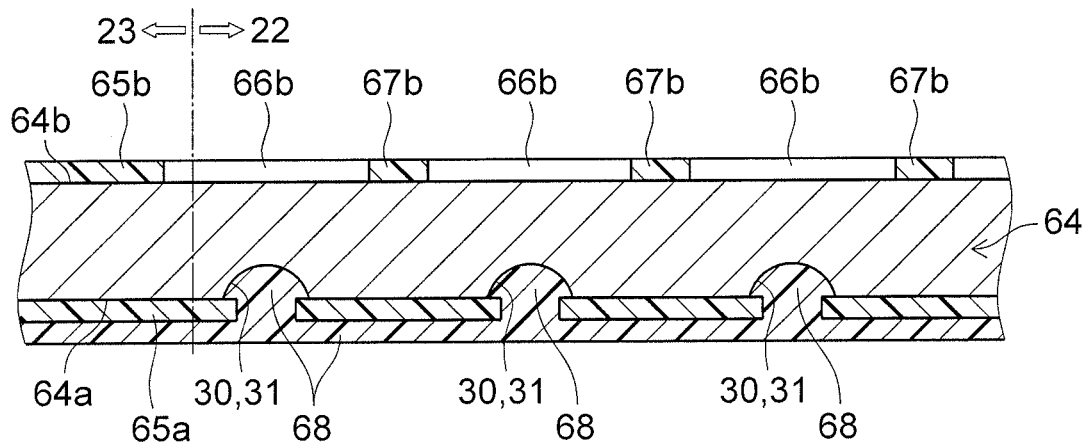
FIG. 19 is a view for describing the example of the manufacturing method of a deposition mask.

Thereafter, as shown in FIG. 19, the thus formed first recesses 30 are coated with a resin 68 resistant to the etchant. Namely, the first recesses 30 are sealed with the resin 68 resistant to the etchant. In the example shown in FIG. 19, a film of the resin 68 is formed to cover not only the formed first recesses 30 but also the also the first surface 64a (first resist pattern 65a).

Figure 20:
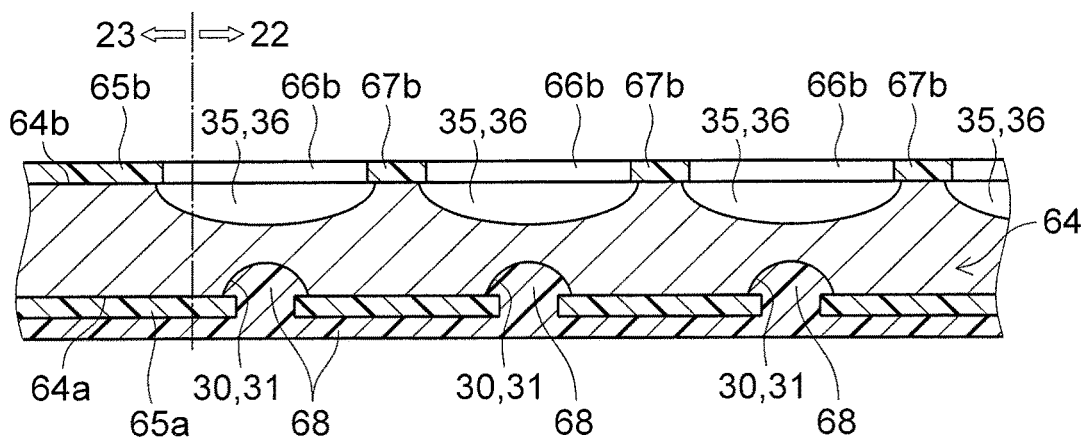
FIG. 20 is a view for describing the example of the manufacturing method of a deposition mask.

Then, as shown in FIG. 20, the metal plate 64 is subjected to a second etching. In the second etching, the metal plate 64 is etched only from the side of the second surface 64b, so that the second recesses 35 are formed from the side of the second surface 64b. Since the first surface 64a of the metal plate 64 is coated with the resin 68 resistant to the etchant, there is no possibility that the shape of the first recess 30, which has formed to have a desired shape by the first etching, is damaged.

Figure 21:
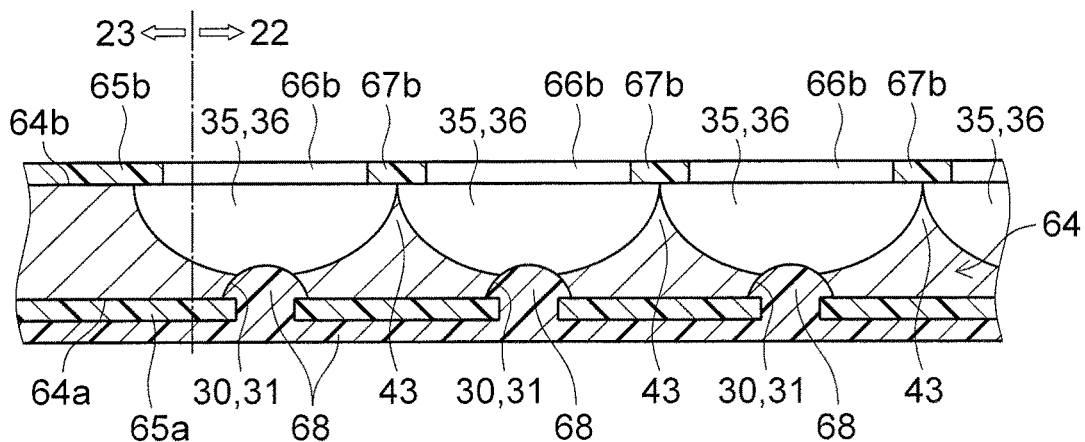
FIG. 21 is a view for describing the example of the manufacturing method of a deposition mask.

The erosion by the etching develops in a part where the metal plate 64 is in contact with the etchant. Thus, the erosion develops not only in the normal direction (thickness direction) of the metal plate 64 but also in a direction along the plate plane of the metal plate 64. As a result, as shown in FIG. 21, not only the etching develops in the normal direction of the metal plate 64 so that the second recess 35 is connected to the first recess 30, but also the two second recesses 35, which are respectively formed on positions facing adjacent two apertures 66b of the second resist pattern 65b, merge on the reverse to a bridge portion 67b positioned between the two apertures 66b.

Figure 22:
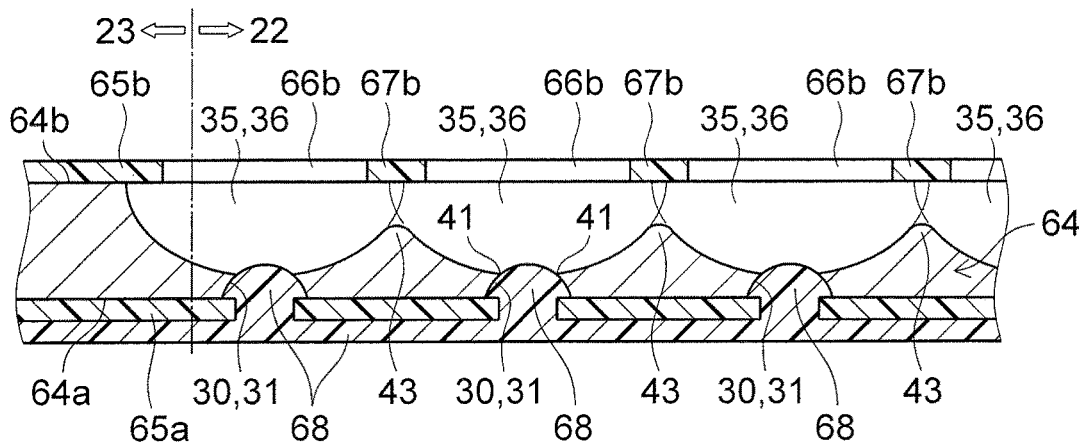
FIG. 22 is a view for describing the example of the manufacturing method of a deposition mask.

As shown in FIG. 22, when the etching from the side of the second surface 64b of the metal plate 64 further develops, the merged portion 43 formed by the adjacent two second recesses 35 that are merged is separated from the second resist pattern 65b (bridge portion 67b), and the erosion by etching develops in the merged portion 43 in the normal direction (thickness direction) of the metal plate 64.

Thus, the merged portion 43 pointed toward one side along the normal direction of the deposition mask 20 is etched so as to be chamfered as illustrated. Thus, the inclination angle θ (see FIG. 7), which is defined by the wall surface 36 of the second recess 35 with respect to the normal direction of the deposition mask 20 can be increased. In this manner, the erosion of the second surface 64b of the metal plate 64 by etching develops in the whole area defining the effective area 22 of the metal plate 64.

In this manner, the etching from the side of the second surface 64b of the metal plate 64 develops by a predetermined amount, and the second etching to the metal plate 64 ends. At this time, the second recess 35 extends up to a position at which the second recess 35 reaches the first recess 30 along the thickness direction of the metal plate 64, so that the through hole 25 is formed in the metal plate 64 by the second recess 35 and the first recess 30 that communicate to each other.

Thereafter, the resin 68 is removed from the metal plate 64. For example, the resin 68 can be removed by using an alkali-based peeling liquid. After that, the resist patterns 65a, 65b are removed. The resist patterns 65a, 65b may be removed simultaneously with the removal of the resin 68.

As shown in FIG. 16, the metal plate 64 with the plurality of through holes 25 formed therein is conveyed to a cutting apparatus 73 by the conveyor rollers 72, 72 that are rotated with the metal plate 64 being sandwiched therebetween. In the illustrated example, the aforementioned core 61 is rotated through a tension (tensile stress) acting on the metal plate 64 by the rotation of the conveyor rollers 72, 72, and the metal plate 64 is supplied from the roll 62.

Thereafter, the metal plate 64 with the plurality of through holes 25 formed therein is cut by the cutting apparatus 73 to have a predetermined length and width. Thus, the sheet-like metal plates 21 each having the plurality of through holes 25, which are shown in FIGS. 6 to 9, are obtained from the metal plate 64. At this time, the first surface 64a of the metal plate 64 provides the first surface 21a of the metal plate 21, and the second surface 64b of the metal plate 64 provides the second surface 21b of the metal plate 21. At this time, due to the difference between the etching amount from the side of the first surface 64a of the metal plate 64 and the etching amount from the side of the second surface 64b of the metal plate 64, a part where a remaining metal amount is large (side of the first surface 64a) and a part where a remaining metal amount is small (side of the second surface 64b) are generated in the plate thickness direction of the metal plate 64. Thus, there is a difference between a residual stress on the side of the first surface 64a of the metal plate 64 and a residual stress on the side of the second surface 64b thereof. Accordingly, the deposition mask 20, which is manufactured by cutting the metal plate 64, is warped to be convex on the first surface 20a, in a cross section orthogonal to the longitudinal direction $d_L$, at least in the central portion of the longitudinal direction $d_L$.

Next, a deposition method using the deposition mask 20 is described with reference to FIGS. 23 to 25. The deposition mask in FIGS. 23 to 25 is shown as a cross section orthogonal to the longitudinal direction $d_L$, in the central portion of the longitudinal direction $d_L$. The deposition method in this embodiment has a contact step in which the deposition mask 20 is brought into contact with a deposition target substrate such that the first surface 20a faces the deposition target substrate, and a deposition step in which the deposition material 98 is deposited onto the deposition target substrate through the respective through holes 25 of the deposition mask 20.

In the contact step, the magnet 93 is disposed to face the upper surface of the organic EL substrate 92 that is an example of a deposition target substrate. Thereafter, the deposition mask 20 is brought close to the organic EL substrate 92 from below the organic EL substrate 92, such that the deposition mask 20 faces the lower surface of the organic EL substrate 92. In particular, the deposition mask 20 is brought close to the organic EL substrate 92 such that the first surface 20a of the deposition mask, which is curved to provide a convex side surface in a cross section orthogonal to the longitudinal direction $d_L$, faces the lower surface of the organic EL substrate 92. In this case, as shown in FIG. 23, the central portion 27 of the width direction $d_W$ of the first surface 20a of the deposition mask 20 is firstly withdrawn to the organic EL substrate 92 by a magnetic force from the magnet 93, so as to be brought into contact with the lower surface of the organic EL substrate 92. In an area sandwiched between the pair of ear areas 24 in the first surface 20a of the deposition mask 20 in this embodiment, the ridge line 28 extending along the longitudinal direction $d_L$ is formed from the end portion on the side of the one ear area 24 to the end portion on the side of the other ear area 24, over the central portion 27 of the width direction $d_W$ of the deposition mask 20. Thus, in the illustrated example, the ridge line 28 of the first surface 20a of the deposition mask 20 is firstly brought into contact with the lower surface of the organic EL substrate 92.

Figure 24:
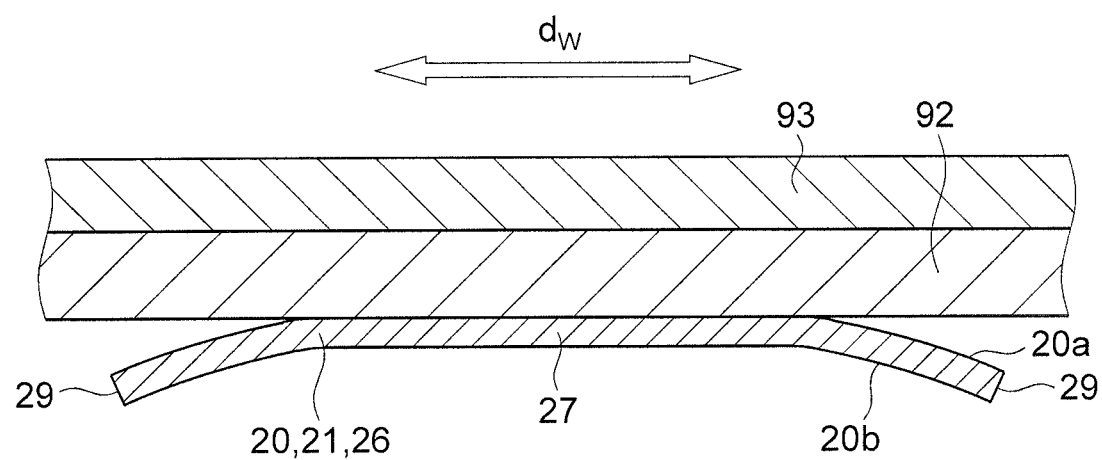
FIG. 24 is a view showing the state in which the deposition mask is brought into contact with the deposition target substrate.
Figure 25:
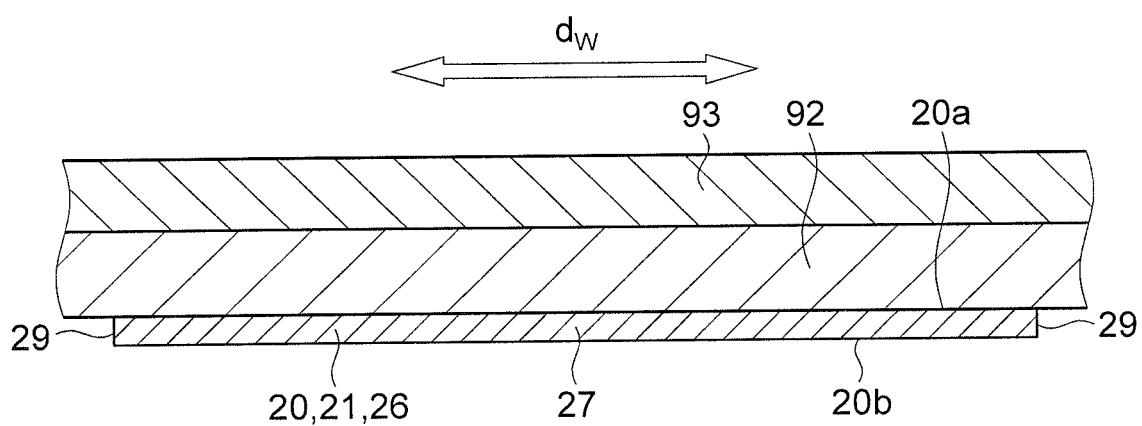
FIG. 25 is a view showing the state in which the deposition mask is brought into contact with the deposition target substrate.

Then, as shown in FIG. 24, portions adjacent in the width direction $d_W$ to the central portion 27 (ridge line 28) of the width direction $d_W$ of the deposition mask 20 are withdrawn to the organic EL substrate 92 by a magnetic force from the magnet 93, so as to be brought into contact with the lower surface of the organic EL substrate 92. Then, the first surface 20a of the deposition mas 20 comes into contact with the lower surface of the organic EL substrate sequentially from the central portion 27 (ridge line 28) of the width direction $d_W$ of the deposition mask 20 toward the edges 29 of the width direction $d_W$. At this time, both edges 29 of the width direction $d_W$ of the deposition mask 20 are not in contact with the lower surface of the organic EL substrate 92. Namely, since both edges 29 are free ends, there is no possibility that the movement of the deposition mask 20 in the plate plane direction of the organic EL substrate 92 is prevented by a frictional force between the edges 29 and the lower surface of the organic EL substrate 92.

Thereafter, the first surface 20a in the edges 29 of the width direction $d_W$ of the deposition mask 20 is brought into contact with the lower surface of the organic EL substrate 92. Thus, the whole first surface 20a of the deposition mask 20 is in contact with the lower surface of the organic EL substrate 92, without getting wrinkled.

After the contact step, while the deposition mask 20 is in contact with the lower surface of the organic EL substrate 92, the deposition material 98 is deposited onto the organic EL substrate 92 through the respective through holes 25 of the deposition mask 20.

The deposition mask 20 in this embodiment comprises the first surface 20a facing to a deposition target substrate, and the second surface 20b opposite to the first surface 20a, wherein: the deposition mask 20 includes: the effective area 22 in which the plurality of through holes 25 are formed; and the longitudinal direction $d_L$ in which one or more of the effective areas 22 are arranged along the longitudinal direction $d_L$ wherein: at least in a central area of the longitudinal direction, the deposition mask 20 is warped to be convex on the first surface 20a in a cross section orthogonal to the longitudinal direction $d_L$.

In addition, the deposition method in this embodiment includes a contact step in which the deposition mask 20 is brought into contact with the deposition target substrate such that the first surface 20a faces the deposition target substrate, and a deposition step; in which the deposition material 98 is deposited onto the deposition target substrate through the respective through holes 25 of the deposition mask 20. In the contact step, in the central portion of the deposition mask 20 along the longitudinal direction $d_L$, the central portion 27 of the width direction $d_W$ of the deposition mask 20 is firstly brought into contact with the deposition target substrate, and thereafter the deposition mask 20 is sequentially brought into contact with the deposition target substrate toward the edges 29 of the width direction $d_W$ of the deposition mask 20.

According to such a deposition mask 20 and such a deposition method, when the deposition mask 20 is brought into contact with a deposition target substrate, the central portion 27 (ridge line 28) of the width direction $d_W$ of the deposition mask 20 can be firstly brought into contact with the deposition target substrate, and thereafter, the deposition mask 20 can be sequentially brought into contact with deposition target substrate toward the edges 29 of the width direction $d_W$. In this process, both edges 29 of the width direction $d_W$ of the deposition mask 20 are not in contact with the lower surface of the deposition target substrate. Namely, since both edges 29 are free ends, there is no possibility that the movement of the deposition mask 20 in the plate plane direction of the deposition target substrate is prevented by a frictional force between the edges 29 and the lower surface of the deposition target substrate. Thus, while the deposition mask 20 can be effectively prevented from getting wrinkled, the deposition mask 20 can be brought into contact with the deposition target substrate.

In addition, the deposition mask 20 further includes the peripheral area 23 surrounding the effective area 22, wherein a value of a difference (D2−D1) between a distance D2 and a distance D1 is larger than 0 mm and smaller than 0.05 mm, in which out of one or more total pitch marks 47 disposed on one side of the width direction $d_W$ of the effective area 22 in the peripheral area 23, a total pitch mark 47 closest to the central portion of the longitudinal direction $d_L$ is represented as a first total pitch mark 47a; out of one or more total pitch marks 47 disposed on the other side of the width direction $d_W$ of the effective area 22 in the peripheral area 23, a total pitch mark 47 corresponding to the first total pitch mark 47a is represented as a second total pitch mark 47b, a distance along the width direction $d_W$ between the first total pitch mark 47a and the second total pitch mark 47b is represented as D1 (mm) when the deposition mask is placed on a horizontal flat surface such that the first surface faces upward; a distance along the width direction $d_W$ between the first total pitch mark 47a and the second total pitch mark 47b is represented as D2 (mm) when the deposition mask is placed on a horizontal flat surface such that the first surface faces upward and the deposition mask is loaded from above so that the deposition mask is flattened.

Further, in the deposition mask in this embodiment, a value of a difference (D2−D1) between the distance D2 and the distance D1 is larger than 0 mm and smaller than 0.05 mm, in which out of one or more through holes 25 located closest to the edge 29 on one side of the width direction $d_W$ of the deposition mask 20, a through hole 25 closest to the central portion of the longitudinal direction $d_L$ is represented as a first through hole 25a, out of one or more through holes 25 located closest to the edge 29 on the other side of the width direction $d_W$ of the deposition mask 20, a through hole 25 whose separation distance to the first through hole 25a along the longitudinal direction $d_L$ is shortest is represented as a second through hole 25b; a distance along the width direction $d_W$ between the first through hole 25a and the second through hole 25b is represented as D1 (mm) when the deposition mask is placed on a horizontal flat surface such that the first surface faces upward; and a distance along the width direction $d_W$ between the first through hole 25a and the second through hole 25b is represented as D2 (mm) when the deposition mask is placed on a horizontal flat surface such that the first surface faces upward and the deposition mask is loaded from above so that the deposition mask is flattened.

According to such a deposition mask 20, it is not necessary to cut the deposition mask 20, and a warp degree of the deposition mask 20 can be evaluated by using a simple measuring apparatus. Thus, evaluation precision and evaluation speed of a warp of the deposit mask 20 can be effectively improved. In addition, cost for evaluating a warp of the deposition mask can be effectively suppressed.

The aforementioned embodiment can be variously modified. When the effect obtained by the aforementioned embodiment is apparently obtained in the modification examples, description thereof is omitted.

In the above embodiment, the through hole 25 is formed by communicating the first recess 30 and the second recess 35 with each other. However, the shape of the through hole 254 and the method of forming the same are not limited to the aforementioned example. For example, each through hole 25 may be formed only of one recess, such as the first recess 30 or the second recess 35.

As the other modification example, in the above embodiment, the deposition mask 20 is made of the metal plate 21 that is formed by etching the metal plate 64 to form the through holes 25, but the present disclosure is not limited thereto. For example as the deposition mask, the deposition mask 20 manufactured by plating may be used. When the deposition mask is manufactured by plating, for example, as disclosed in JP2016-148112A, a metal layer may be deposited by plating on an area other than areas in which the through holes 25 are formed, and the deposition mask 20 may be made of the deposited metal layer.

When the metal layer is deposited by plating, a stress remains in the deposited metal layer (plating layer). Thus, after the deposition of the metal layer by plating, the deposition mask 20 formed of the metal layer is subjected to an annealing step. By adjusting a holding a holding temperature and/or a holding time of the deposition mask 20 in the annealing step, a stress remaining in the deposition mask 20 is allowed to remain therein at a desired amount. Thus, a difference in remaining stress amounts is generated between the side of the first surface 20a of the deposition mask 20 and the second surface 20b thereof. In this manner, the deposition mask 20 can be warped to be convex on the first surface 20a, in a cross section orthogonal to the longitudinal direction $d_L$, at least in the central portion of the longitudinal direction $d_L$.

EXAMPLES

The present disclosure is described in more detail herebelow based on examples. However, these examples are mere experiment results, and the present disclosure should not be construed and limited to the experiment results.

A plurality of deposition masks described below were actually manufactured. A deposition material was deposited onto a deposition target substrate with the use of each deposition mask, and deposition quality was studied.

A metal plate made of 36% nickel-iron alloy was rolled by a 12-stage roller manufactured by KOBELCO to have a thickness of 20 μm. The metal plate was annealed at a predetermined temperature and time, and then first recesses and second recesses are formed in the metal plate by etching. The metal plate was then cut to manufacture a deposition mask with through holes formed of the first recesses and the second recesses. The deposition mask had a length of 1200 mm and a width of 65 mm. The deposition mask had seven effective areas along the longitudinal direction. Each effective area was 132 mm in length along the longitudinal direction of the deposition mask, and 64 mm in width along the width direction of the deposition mask. Each effective area had 2560 through holes along the longitudinal direction of the deposition mask, and 1440 through holes along the width direction thereof. Each through hole had a circular shape having a size of 30 μm along the longitudinal direction of the deposition mask and a size of 30 μm along the width direction thereof, in the through portion.

Example 1

All the manufactured deposition masks were warped to be convex on the first surface providing a surface facing a deposition target substrate, in a cross section orthogonal to the longitudinal direction in the central portion in the longitudinal direction. D1 (mm) and D2 (mm) were measured for each deposition mask. To be specific, each deposition mask was placed on a horizontal flat surface such that the first surface faced upward, and a distance along the width direction between the first total pitch mark and the second total pitch mark that were closest to the center of the longitudinal direction, so as to obtain a value of D1 (mm). In addition, the deposition mask was placed on the horizontal flat surface such that the first surface faced upward, a glass plate is placed on the deposition mask from above, and a load is applied from the glass plate to the deposition mask so that the deposition mask was flattened. A distance along the width direction between the first total pitch mark and the second total pitch mark was measured, so as to obtain a value of D2 (mm). The values of D1 and D2 were obtained by measuring optically from above by using an automatic two-dimensional coordinate measuring machine AMIC1710D manufactured by SINTO S-PRECISION, LTD. To be specific, the values of D1 and D2 were calculated by obtaining respective center coordinates of the first total pitch mark and the second total pitch mark, and by calculating the distance along the width direction between the centers. Thereafter, a value of difference (D2−D1) (mm) between D2 and D1 was calculated for each deposition mask.

Example 2

In each deposition mask, out of the plurality of through holes located closest to the edge on one side of the width direction of the deposition mask, a through hole closest to the center of the longitudinal direction was represented as a first through hole. In addition, out of the plurality of through holes located closest to the edge on the other side of the width direction of the deposition mask, a through hole whose separation distance to the first through hole along the longitudinal direction is shortest was represented as a second though hole. The deposition mask was placed on a horizontal flat surface such that the first surface faced upward, and a distance along the width direction between the first through hole and the second through hole was measured, so as to obtain a value of D1 (mm). In addition, the deposition mask was placed on the horizontal flat surface such that the first surface faced upward, a glass plate is placed on the deposition mask from above, and a load is applied from the glass plate to the deposition mask so that the deposition mask was flattened. A distance along the width direction between the first through hole and the second through hole was measured, so as to obtain a value of D2 (mm). The process was performed similarly to Example 1, excluding that the values of D1 and D2 were obtained by using the first through hole and the second through hole in place of the first total pitch mark and the second total pitch mark. The values of D1 and D2 were obtained by obtaining respective center coordinates of the first through hole and the second through hole, and by calculating the distance along the width direction between the centers.

The manufactured deposition masks were fixed at their ear areas to a frame by welding. Thus, a deposition mask apparatus including the deposition masks and the frame was manufactured.

A deposition target substrate made of no alkali glass having a plan dimension of 900 mm×1500 mm and a thickness of 0.5 mm was prepared. In addition, a permanent magnet and an electromagnet in which a magnetism direction could be adjusted to increase or decrease a magnetic force of the permanent magnet, each having a plan dimension of 900 mm×1500 mm, were prepared. The permanent magnet and the electromagnet were placed on a surface of the deposition target substrate, which was opposed to the side on which the deposition mask was disposed, so as to be in contact with the deposition target substrate. The first surface of each deposition mask of the deposition mask apparatus was brought into contact with the surface opposed to the side on which the magnets were disposed. Thereafter, a deposition material formed on an organic luminescent material was deposited onto the deposition target substrate through the through holes formed in each deposition mask. After the deposition masks were removed from the deposition target substrate, deposition quality of the deposition material onto the deposition target substrate was evaluated. The deposition quality of the deposition material was evaluated by means of a two-dimensional coordinate dimension measuring machine. Note that, as described below, a deposition mask which had already got wrinkled after manufacture was not used for depositing the deposition material onto the deposition target substrate, and thus the deposition quality evaluation was not performed.

FIGS. 26 and 27 are tables showing, out of the manufactured deposition masks, as to deposition masks warped to be convex on the first surface in a cross section orthogonal to the longitudinal direction in the center portion of the longitudinal direction, an annealing condition in these examples (annealing temperature and annealing time), a value (D2−D1) of the deposition mask manufactured through the annealing of each annealing condition, and deposition quality using each deposition mask. In the column of deposition quality, "◯" (one circle) indicates a deposition mask in which dimensional precision and positional precision of the deposition material in each pixel had a level that could be used as a product, "⊚" (two concentric circles) indicates a deposition mask having a higher dimensional precision and a higher positional precision of the deposition material in each pixel, and "−" indicates a deposition mask having wrinkles after manufacture so that its deposition quality was not evaluated, respectively. FIG. 26 shows the deposition quality of Example 1, and FIG. 27 shows the deposition quality of Example 2.

In Example 1 and Example 2, it was confirmed that the deposition mask warped to be convex on the first surface in a cross section orthogonal to the longitudinal direction did not get wrinkled, so that dimensional precision and positional precision of the deposition material in each pixel had a level that could be used as a product to ensure excellent quality. Thus, in an organic EL substrate manufactured with the use of these deposition masks, excellent luminescent quality can be ensured. In addition, in the deposition mask in which a value of (D2−D1) was within a range of not less than 0.015 mm and not more than 0.050 mm, it was configured that the deposition material in each pixel had a higher dimensional precision and a higher positional precision to ensure further excellent deposition quality. Thus, in an organic EL substrate manufactured with the use of these deposition masks, further excellent luminescent quality can be ensured.

On the other hand, out of the manufactured deposition masks, as to deposition masks warped to dent to the side of the first surface in a cross section orthogonal to the longitudinal direction in the center portion of the longitudinal direction, both edges of the width direction were firstly brought into contact with a deposition target substrate, and the central portion of the width direction got wrinkled. As a result, the size and the shape of the deposition material in each pixel varied, and positional displacement occurred.

What is claimed is:

1. A deposition mask used in depositing a depositing material onto a deposition target substrate, comprising a first surface facing to the deposition target substrate, and a second surface opposite to the first surface,
wherein:
the deposition mask includes:
an effective area in which a plurality of through holes are formed;
a longitudinal direction in which one or more of the effective areas are arranged along the longitudinal direction, the longitudinal direction extending from a first end of the deposition mask, through a central portion of the deposition mask, to a second end of the deposition mask; and
a width direction orthogonal to the longitudinal direction;
wherein:
at least in the central portion of the longitudinal direction, the deposition mask is warped to be convex on the first surface in a cross section in the width direction, and the extent to which the deposition mask is warped is larger in the central portion than in the first and second ends.

2. The deposition mask according to claim 1, further including a peripheral area surrounding the effective area and a plurality of pitch marks disposed in the peripheral area,
wherein one pitch mark disposed on one side of the effective area in the width direction and closest to the central portion of the longitudinal direction is represented as a first total pitch mark;
wherein one pitch mark disposed on the other side of the effective area in the width direction and corresponding to the first total pitch mark is represented as a second total pitch mark;
wherein D1 is a measured distance along the width direction between the first total pitch mark and the second total pitch mark when the deposition mask is in a warped state;
wherein D2 is a measured distance on the first surface of the deposition mask between the first total pitch mark and the second total pitch mark when the deposition mask is in a flat state; and
wherein a value of a difference (D2−D1) between a distance D2 and a distance D1 is larger than 0 mm and smaller than 0.05 mm.

3. The deposition mask according to claim 1, further including through holes,
wherein a through hole located closest to an edge on one side of the deposition mask in the width direction and closest to the central portion of the longitudinal direction is represented as a first through hole;
wherein a through hole located closest to an edge on the other side of the deposition mask in the width direction and having a shortest separation distance to the first through hole along the longitudinal direction is represented as a second through hole;
wherein D1 is a measured distance along the width direction between the first through hole and the second through hole when the deposition mask is in a warped state;
wherein D2 is a measured distance on the first surface of the deposition mask between the first through hole and the second through hole when the deposition mask is in a flat state; and
a value of a difference (D2−D1) between a distance D2 and a distance D1 is larger than 0 mm and smaller than 0.05 mm.

4. The deposition mask according to claim 1,
wherein the deposition mask includes the central portion and end portions, and wherein the end portions are flat.

* * * * *